(12) United States Patent
Sommer et al.

(10) Patent No.: US 6,276,998 B1
(45) Date of Patent: Aug. 21, 2001

(54) PADLESS SUBSTRATE CARRIER

(75) Inventors: Phillip R. Sommer, Newark; Paul B. Butterfield, San Jose, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/258,042

(22) Filed: Feb. 25, 1999

(51) Int. Cl.[7] ................. B24B 1/00; B24B 5/00
(52) U.S. Cl. .............. 451/41; 451/285; 451/286; 451/289; 451/388
(58) Field of Search ............... 451/41, 285–289, 451/388

(56) References Cited

U.S. PATENT DOCUMENTS

| | | | |
|---|---|---|---|
| 5,193,316 | * 3/1993 | Olmstead | 451/285 |
| 5,651,724 | * 7/1997 | Kimura et al. | 451/285 |
| 5,670,011 | * 9/1997 | Togawa et al. | 451/288 |
| 5,762,539 | * 6/1998 | Nakashiba et al. | 451/41 |
| 5,795,215 | * 8/1998 | Guthrie et al. | 451/286 |
| 5,868,896 | * 2/1999 | Robinson et al. | 451/289 |
| 5,885,135 | * 3/1999 | Desorcie et al. | 451/41 |
| 5,906,532 | * 5/1999 | Nakajima et al. | 451/41 |
| 5,964,646 | * 10/1999 | Kassir et al. | 451/41 |
| 6,004,193 | * 12/1999 | Nagahara et al. | 451/288 |
| 6,012,964 | * 1/2000 | Arai et al. | 451/41 |
| 6,033,292 | * 3/2000 | Inaba | 451/288 |
| 6,074,289 | * 6/2000 | Murakami et al. | 451/288 |
| 6,102,788 | * 8/2000 | Uto | 451/288 |
| 6,113,480 | * 9/2000 | Hu et al. | 451/388 |

FOREIGN PATENT DOCUMENTS

| | | | |
|---|---|---|---|
| 0589433 A1 | 3/1994 | (EP) | B24B/37/04 |
| 0868975 A1 | 10/1998 | (EP) | B24B/37/04 |
| 0896858 A1 | 2/1999 | (EP) | B24B/37/04 |

OTHER PUBLICATIONS

"Pressurized Wafer Holder for Uniform Polishing" Research Disclosure, GB, Industrial Opportunities Ltd. Havant, No. 32224, Feb. 1, 1991, p. 95, XP000168310 ISSN: 0374–4353.

* cited by examiner

*Primary Examiner*—M. Rachuba
(74) *Attorney, Agent, or Firm*—Thomason, Moser & Patteson

(57) ABSTRACT

Apparatus and method of polishing substrates using a carrier that does not contact the backside of the substrate during polishing. The apparatus preferably forms an air bearing between the substrate and the carrier plate during polishing. Alternatively, liquids, or combinations of liquids and gases may be used to form the bearing layer. When a water layer is formed, at least a portion of the carrier plate is formed as a microporous force applicator. The apparatuses are also capable of adjusting the force profile that is applied to the substrate so as to differentially polish different areas of the substrate. A containment ring is provided for horizontal containment of the substrate during polishing and to define an area within which the substrate precesses during polishing. A containment ring or barrier is also provided for precessing with a substrate during polishing.

69 Claims, 14 Drawing Sheets

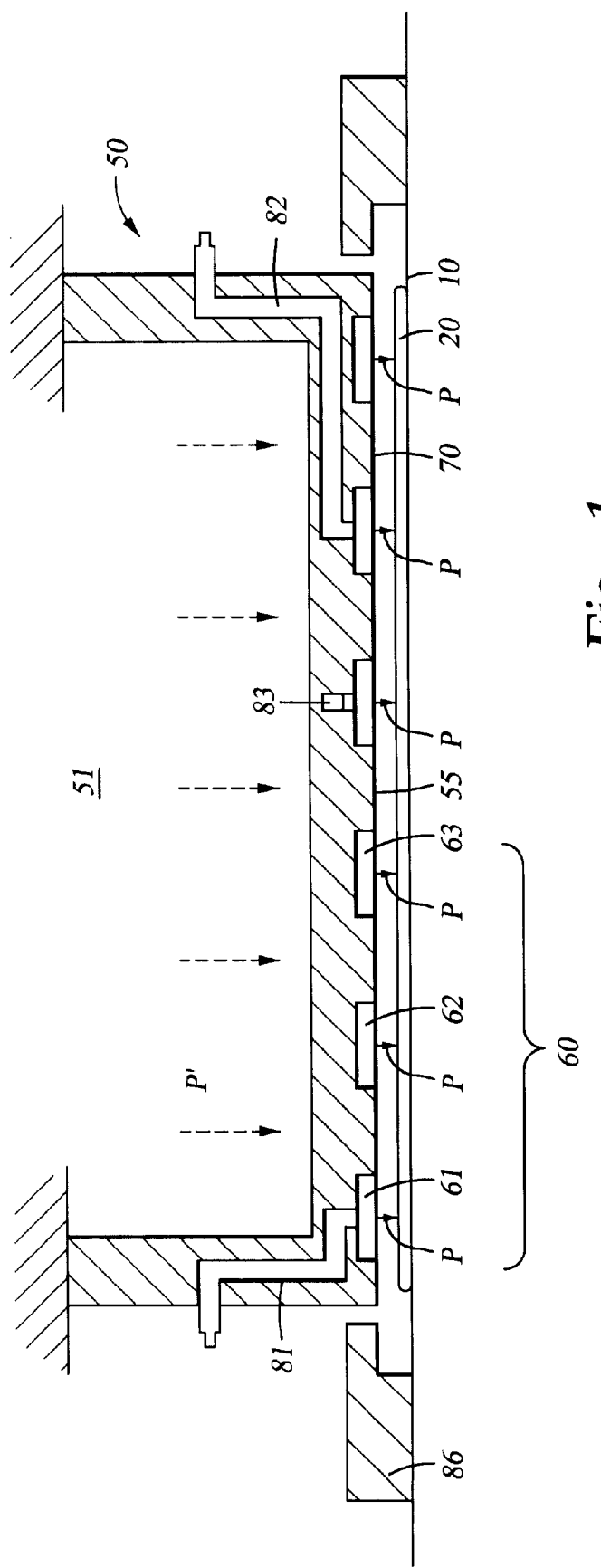
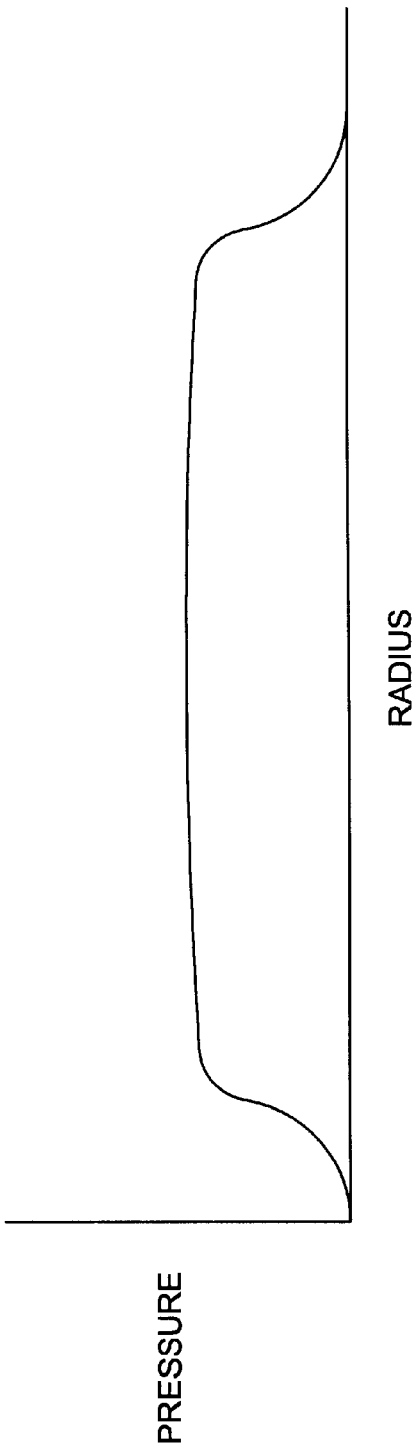

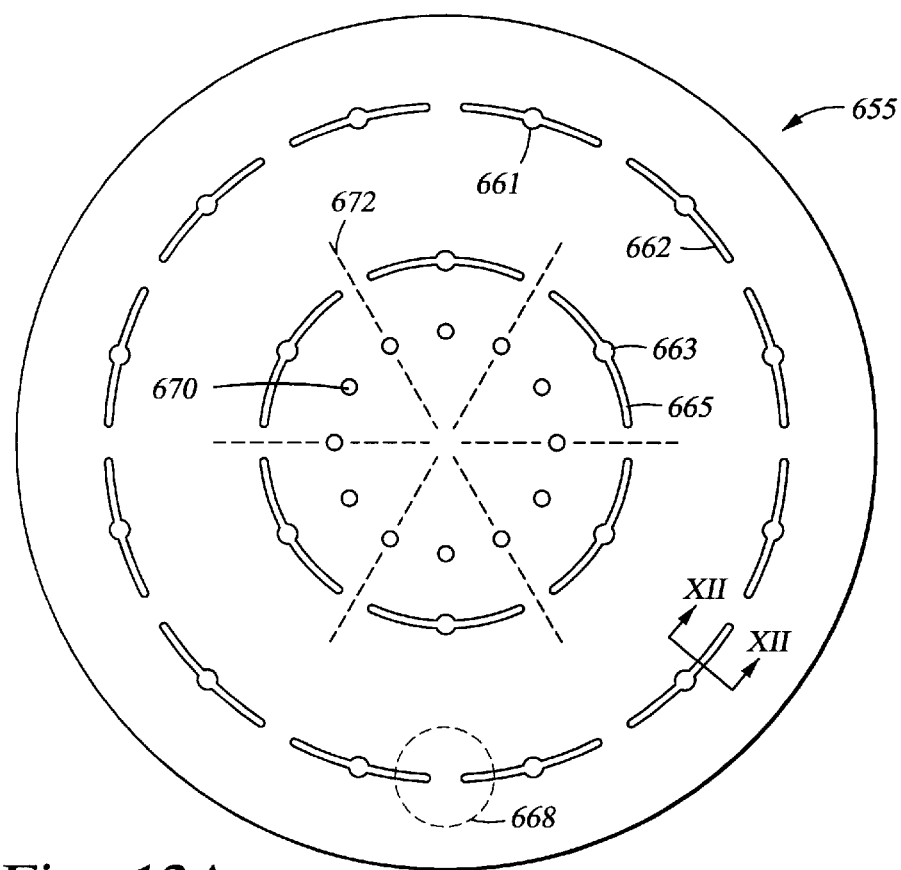
*Fig. 12A*
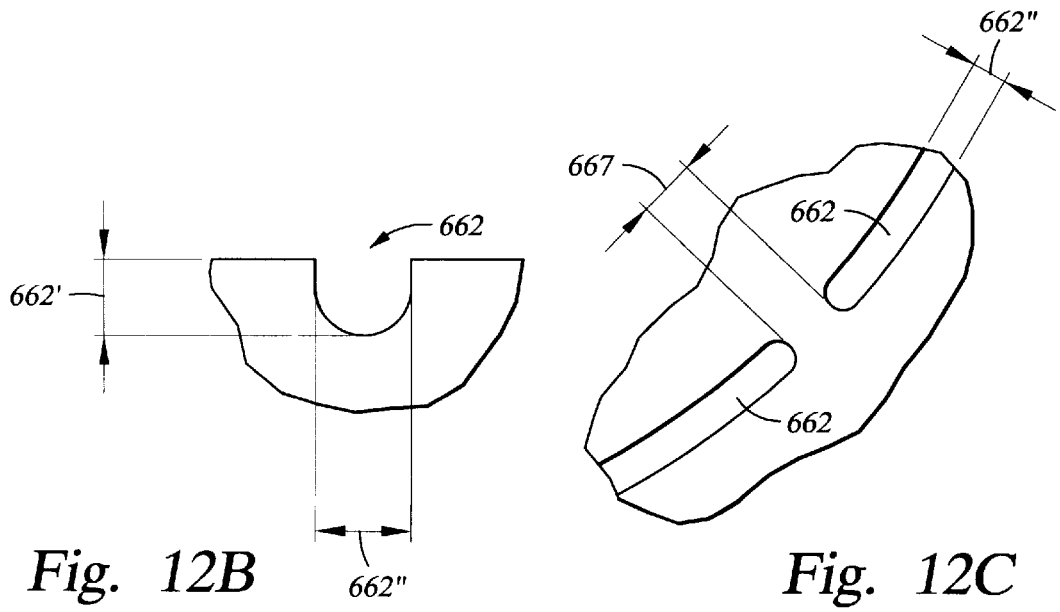
*Fig. 12B*          *Fig. 12C*

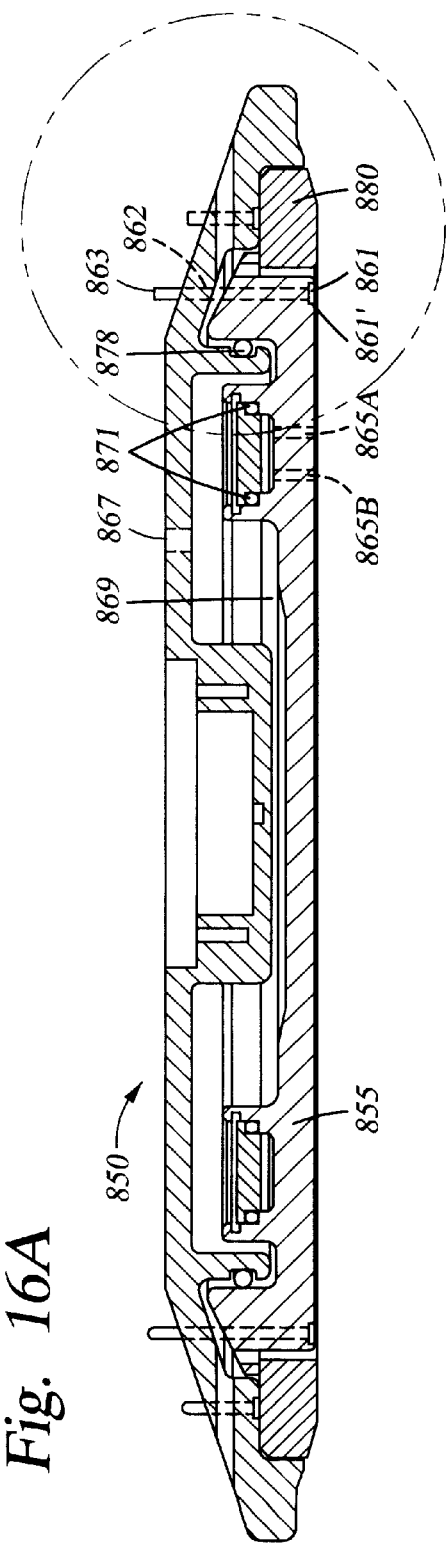
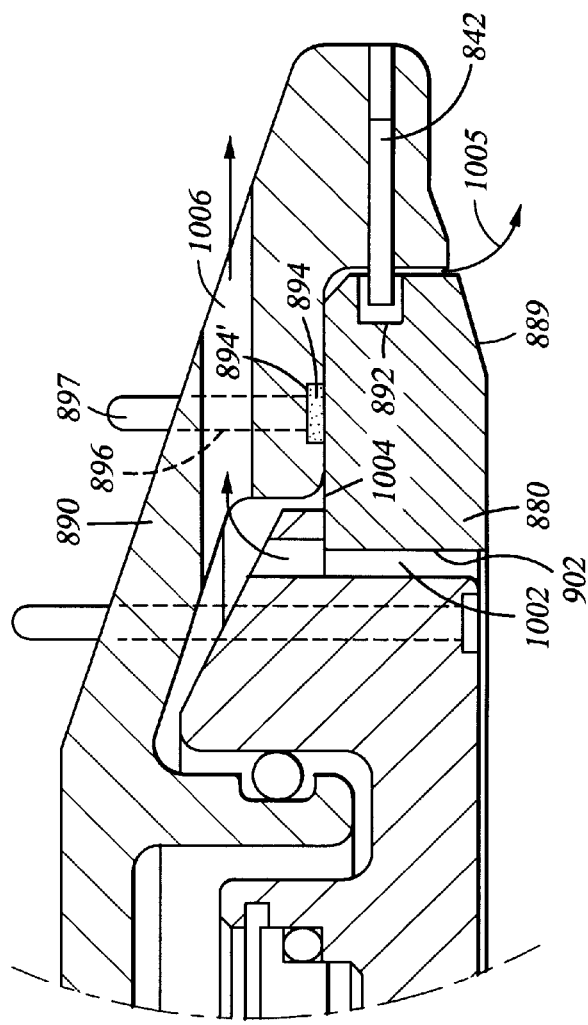
Fig. 16A
Fig. 16B

PADLESS SUBSTRATE CARRIER

TECHNICAL FIELD

The present invention relates to the field of polishing of substrates and particularly the polishing of substrates by chemical mechanical polishing processes. Particularly, the present invention is directed toward improvement in a substrate carrier to be used to polish substrates and methods of polishing with the improved substrate carrier.

BACKGROUND ART

As part of the manufacturing process of semiconductor devices, semiconductor wafers are increasingly being polished by CMP. The uniform removal of material from and the planarity of patterned and un-patterned wafers is critical to wafer process yield. Generally, the wafer to be polished is mounted on a substrate carrier which holds the wafer using a combination of vacuum suction or other means and, most often, a wafer backing pad to contact the rear side of the wafer. A retaining lip or ring is generally provided around the edge of the wafer to keep the wafer contained under the substrate carrier. The front side of the wafer, the side to be polished, is then contacted with an abrasive material such as an abrasive pad or abrasive strip. The abrasive pad or strip may have free abrasive fluid sprayed on it, may have abrasive particles affixed to it, or may have abrasive particles sprinkled on it.

The ideal wafer polishing process can be described by Preston's equation:

$$R=K_p*P*V,$$

where R is the removal rate; Kp is a function of consumables (abrasive pad roughness and elasticity, surface chemistry and abrasion effects, and contact area); P is the applied pressure between the wafer and the abrasive pad; and V is the relative velocity between the wafer and the abrasive pad. As a result, the ideal CMP process should have constant cutting velocity over the entire wafer surface, constant pressure between the abrasive pad and wafer, and constant abrasive pad roughness, elasticity, area and abrasion effects. In addition, control over the temperature and pH is critical and the direction of the relative pad/wafer velocity should be randomly distributed over the entire wafer surface.

One common type of wafer polishing apparatus is the CMP model 372M made by Westech Systems Inc. A wafer is held by a substrate carrier of the model 372M. The substrate carrier rotates about the axis of the wafer. A large circular abrasive pad is rotated while contacting the rotating wafer and substrate carrier. The rotating wafer contacts the larger rotating abrasive pad in an area away from the center of the abrasive pad.

Another related apparatus is a polishing machine for polishing semiconductor wafers containing magnetic read-write heads, disclosed in U.S. Pat. No. 5,335,453 to Baldy et al. With this machine, a semiconductor wafer is held by a substrate carrier which is moved in a circular translatory motion by an eccentric arm. The wafer is polished by contacting an abrasive strip which is advanced in one direction. The relative motion between the wafer and the abrasive strip is a combination of the circular motion of the wafer and the linear motion of the advancing abrasive strip. Connected to the eccentric arm is a support head that includes a rigid part and a "flexible disk" made from a "flexible material" having a "certain thickness". The wafer 44 to be polished is described as being "partly embedded in the disk 142 during polishing by the effect of the force exerted on the support head".

The gimbal point of a CMP substrate carrier is a critical element of the polishing process. The substrate carrier must align itself to the polish surface precisely to insure uniform, planar polishing results. Many CMP substrate carriers currently available yield wafers having anomalies in planarity. The vertical height of the pivot point above the polishing surface is also important, since the greater the height, the larger the moment that is induced about the pivot point during polishing. Two pervasive problems that exist in most CMP wafer polishing apparatuses are underpolishing of the center of the wafer, and the inability to adjust the control of wafer edge exclusion as process variables change.

For example, substrate carriers used on many available CMP machines experience a phenomenon known in the art as "nose diving". During polishing, the head reacts to the polishing forces in a manner that creates a sizable moment, which is directly influenced by the height of the gimbal point, mentioned above. This moment causes a pressure differential along the direction of motion of the head. The result of the pressure differential is the formation of a standing wave of the chemical slurry that interfaces the wafer and the abrasive surface. This causes the edge of the wafer which is at the leading edge of the substrate carrier, to become polished faster and to a greater degree than the center of the wafer.

The removal of material on the wafer is related to the chemical action of the slurry. As slurry is inducted between the wafer and the abrasive pad and reacts, the chemicals responsible for removal of the wafer material gradually become exhausted. Thus, the removal of wafer material further from the leading edge of the substrate carrier (i.e., the center of the wafer) experiences a diminished rate of chemical removal when compared with the chemical action at the leading edge of the substrate carrier (i.e., the edge of the wafer), due to the diminished activity of the chemicals in the slurry when it reaches the center of the wafer. This phenomenon is sometimes referred to as "slurry starvation".

Apart from attempts to reshape the crown of the substrate carrier, other attempts have been made to improve the aforementioned problem concerning "nose diving". In a prior art substrate carrier that gimbals through a single bearing at the top of the substrate carrier, sizable moments are generated because the effective gimbal point of the substrate carrier exists at a significant, non-zero distance from the surface of the polishing pad. Thus, the frictional forces, acting at the surface of the polishing pad, act through this distance to create the undesirable moments.

U.S. Pat. No. 5,377,451 to Leoni et al. describes a wafer carrier that "projects" the effective gimbal point down to the surface of the polishing pad, thereby eliminating the moment arm through which the frictional forces create the undesirable "nose diving". Leoni et al. produce this effect by instituting a conical bearing assembly which allows the projection of a "universal pivot point" to a point that is located at or near the surface of the polishing surface. The solution proposed by Leoni et al., however, requires the use of a number of bearings in the assembly in order to effect this projection, thereby increasing the cost of the wafer carrier. Additionally, there is still a moment produced because of the actual contact points at the bearings. There is also a substantial risk that, due to inexact manufacturing, the projected pivot point will not lie exactly on the contact surface of the carrier, which will also introduce moments.

FIG. 17 shows a prior art carrier design 900 which transfers the polishing load from a bellows 910 to a guided shaft 920 into a gimbal 930 (shown in phantom to illustrate the gimbal point 933 and outward into a carrier plate 940. If the gimbal mechanism is not free, stiction will prevent the gimbal 930 from its intended free and smooth movement and the guided shaft 920 will begin to over-constrain the system during polishing.

Additionally, it is not uncommon for loads in this type of a system to become excessive enough to cause plastic deformation of the gimbal. Because of the offset rotation points of the gimbal 930 and the ring flexure 950, the dynamics of such a carrier assembly can become unstable during a high friction polishing operation.

A semiconductor wafer polishing apparatus by Banks in U.S. Pat. No. 4,373,991, uses a plurality of channels 27 to inject pressurized water, preferably slightly greater than 15 psi, between a plate and a wafer to allow free floating of the wafer. However, the carrier of Banks uses a conventional gimbal arrangement and therefore experiences the moment induced anomalies such as nose-diving and crowning, as discussed above.

Another phenomenon which generates anomalies in the edge areas of a substrate that is polished by conventional techniques is due to limitations inherent in a carrier that employs a deformable/conformable crown or plate. For example Applied Materials European Patent Application No. EP 0 774 323 A2 discloses a carrier head having a lower planar surface 9104 and a bow chamber 9102 which is capable of being pressurized so as to bow out the surface 9104, or reduced in pressure to bow in the surface 9104. A bellows cavity 1192 is pressurizable to bias the entire carrier plate 1164, including the surface 9104 toward the polishing surface for loading the substrate to be polished.

FIG. 18 illustrates a problem inherent in a prior art carrier 1100 having a deformable plate 1110. Upon deformation of the plate 1110 by application of pressure thereto, either through increasing the pressure within chamber 1130 or by other means, the deflection of the plate 110 is greater toward the center of the plate than at the edge areas 1120 (as shown in phantom in FIG. 16). This is true even if greater flexibility is afforded at the edge areas through living hinges or other mechanisms to extend the flexibility outward, since the very edge defines a boundary of fixed points that do not deflect. The plate 1110 deflects according to the typical bending formula (as shown in phantom in FIG. 16) which results in a relative underpolishing of the edges of the wafer.

U.S. Pat. No. 5,635,083 to Breivogel et al., discloses a method and apparatus for chemical mechanical polishing of a substrate having a wafer carrier attached to a steel rotatable drive shaft which is hollow to allow pneumatic pressure to be conveyed into a chamber created above the backside of a wafer to be polished and below the base of the carrier. A wear resistant retaining ring extends from the base of the carrier and surrounds and is in contact with the wafer to be polished. A resilient lip seal is attached just inside the retaining ring and seals with the backside of the wafer to form the chamber together with the base of the carrier. Not only does this arrangement restrict wafer precession because of the seal contact, but there is also always a risk of not forming an adequate seal due to contamination between the seal and the backside of the wafer, by slurry or other contaminants.

An apparatus described in JP 9-225821 to Ebara Corp. includes first, second and third pressure chambers within a top ring that is used to polish a semiconductor wafer. An elastic mat is provided between the top ring and the semiconductor wafer to be polished. The elastic mat and the top ring each have multiple jets which align to connect with the pressure chambers. Three concentrically defined pressure zones are defined on the mat, through which controlled pressures can be applied to the wafer to control the conformation of the pressure profile between the elastic mat and the semiconductor wafer.

DISCLOSURE OF THE INVENTION

The present invention addresses and overcomes the above problem areas.

Because a barrier layer is formed between the carrier and the substrate to be polished, there is no concern for the lack of an adequate seal due to contaminants. Also, because the carrier does not actually contact the backside of the substrate during polishing, there is no need for a backing pad or carrier film as is commonly used in the art. The ability to differentially adjust the pressure applied to the backside of the substrate also allows conformation of the substrate to differentially polish a substrate when the need arises.

The present invention includes a substrate carrier for polishing a substrate against a polishing medium, with the substrate carrier including a plate adapted to position a substrate substantially parallel with the polishing medium, and a force applicator for forming a gaseous layer between the plate and the substrate such that said plate does not contact the substrate during polishing. Preferably, the force applicator includes a microporous material that is integral with the plate. A portion of the plate may be microporous to act as the force applicator.

Preferably, the plate is substantially circular in cross-section and the porous portion includes at least one ring that is substantially concentric with the circular plate. More preferably, the porous portion includes concentric rings, but two or greater than three rings are also possible. The porous rings are fitted into corresponding grooves in the plate, preferably by press fitting.

Alternatively, not all of the grooves need be filled with porous rings. For example, the force applicator may include a series of concentric grooves in the plate, with a pressure emitter surrounded by at least one of the concentric grooves. Preferably, the pressure emitter in such a configuration includes a ruby orifice. Additionally, a vacuum port may be provided to connect at least one of the concentric rings, and preferably two of the rings, with an external vacuum source.

In another embodiment, at least one of the grooves is open to atmospheric pressure. This embodiment further preferably includes at least one groove which is substantially filled with a microporous ring. Each of the microporous rings present is connected to an external source of pressure or vacuum. Preferably, each external source of pressure or vacuum is independent of the others.

Preferably, each of the grooves in the plate is substantially filled with a microporous ring, and each of the microporous rings is connected to an independently controllable source of external pressure or vacuum.

Further included is a containment ring which is located radially external to the plate. Upon forming the gaseous layer between the carrier and the substrate and commencement of polishing movements, the substrate precesses within an area bounded by the containment ring. In a one example, the surface of the containment ring which contacts the polishing media during polishing includes an undercut defining the area within which the precession occurs. The undercut does not contact the polishing media during polishing.

According to the present invention, a substrate carrier for polishing a substrate against a polishing medium is disclosed to include a plate adapted to position a substrate substantially parallel with the polishing medium. The plate includes a microporous material through which a bearing layer is established between the plate and the substrate such that the plate does not contact the substrate. In one embodiment, the face of the plate adjacent the substrate is microporous over substantially the entirety thereof.

In a preferred embodiment, the bearing layer formed is an air bearing. Alternative embodiments may form a liquid bearing layer or a bearing layer including a mixture of gas and liquid.

In another aspect of the invention, a substrate carrier for polishing a substrate against a polishing medium is disclosed as including a plate adapted to position a substrate substantially parallel with the polishing medium; and means for applying a differential force across a back surface of the substrate to conform the substrate to a desired polishing conformation and to separate the plate from contact with the backside of the substrate.

Preferably, the means for applying comprises a microporous material integral with the plate. A portion of the plate may be microporous to form the means for applying a differential force. Preferably, the plate is substantially circular in cross-section and the means for applying includes at least one microporous ring that is substantially concentric with the circular plate. More preferably, three concentric microporous rings are included.

A method of polishing a substrate is disclosed to include positioning a substrate between a substrate carrier and a polishing medium and then applying force to a backside of the substrate via the substrate carrier, so that the substrate contacts the polishing medium and the backside of the substrate does not contact the substrate carrier. Polishing is then commenced by moving at least one of the substrate carrier and the polishing medium relative to the other according to a polishing pattern to maintain substantially constant relative velocity between the polishing medium and all points on the substrate carrier.

Preferably, the application of force includes applying pressurized gas from the substrate carrier toward the backside of the substrate to form a gaseous bearing layer between the substrate carrier and the substrate. More preferably, the application of pressurized gas includes applying pressurized air in a substantially continuous flow to form an air bearing between the substrate carrier and the backside of the substrate.

Alternatively, the application of force may include applying pressurized liquid from the substrate carrier toward the backside of the substrate to form a liquid bearing layer between the substrate carrier and the substrate. Preferably, the application of pressurized fluid includes applying pressurized water in a substantially continuous flow to form a liquid bearing between the substrate carrier and the backside of the substrate.

Still further, the application of pressurized fluid may include applying pressurized water mixed with at least one gas in a substantially continuous flow to form a liquid bearing between the substrate carrier and the backside of the substrate. With this arrangement, the gas to be mixed is preferably air.

In another aspect of the invention, a method of polishing a substrate includes positioning a substrate between a substrate carrier and a polishing medium; applying force to a backside of the substrate via the substrate carrier, so that the substrate contacts the polishing medium and the backside of the substrate does not contact the substrate carrier; adjusting the force to the backside of the substrate via the substrate carrier to conform the substrate to a desired polishing conformation; and moving at least one of the substrate carrier and the polishing medium, relative to the other, to effect polishing of the substrate by the polishing medium.

Preferably, the application of force includes applying pressurized gas from the substrate carrier toward the backside of the substrate to form a gaseous bearing layer between the substrate carrier and the substrate. More preferably, the application of pressurized gas includes applying pressurized air in a substantially continuous flow to form an air bearing between the substrate carrier and the backside of the substrate.

Preferably the substrate carrier includes at least two applicators of pressure or vacuum for applying force, and the applicators are connected to independently controllable external sources of pressure or vacuum. Adjustment of the force to the backside of the substrate includes adjusting at least one of the independently controllable external sources of pressure or vacuum to vary the flow rate thereof.

Further, a method of polishing a substrate is described to include: exerting a pressurized gas between a substrate carrier and a back side of the substrate such that the backside of the substrate does not contact the substrate carrier; and driving at least one of the substrate and a polishing surface to effect a polishing action between a front side of the substrate and the polishing surface, wherein the pressurized gas exerts a polishing force that is substantially normal to a direction of said driving. In a preferred arrangement, the driving causes precessing of the substrate with respect to the substrate carrier.

Still further, a method of polishing a substrate includes: providing a substrate carrier having a backing surface and a containment ring surrounding a perimeter of the backing surface; exerting a pressurized fluid between the backing surface and a back surface of the substrate such that the back surface of the substrate does not contact the backing surface; and precessing the substrate with respect to the containment ring by driving at least one of the substrate carrier and a polishing surface to effect a polishing action between a front surface of the substrate and the polishing surface, wherein an outer perimeter of the containment ring is larger than an outer perimeter of the substrate to effect said precessing of the substrate within the containment ring during said driving.

Preferably, the driving includes driving at least one of the substrate carrier and the polishing surface to maintain substantially constant relative velocity between the polishing surface and all points on the substrate carrier, although the present invention is not so limited, as the polishing media may be provided on a turntable, for example.

In a one embodiment, the method includes: containing a substrate within a space defined by a substrate carrier, a containment ring and a polishing surface; injecting a pressurized gas between a surface of the substrate carrier and the substrate such that the substrate does not contact the substrate carrier; and driving at least one of the substrate carrier and the polishing surface to effect a polishing action between a front side of the substrate and the polishing surface, wherein the pressurized gas exerts a polishing force that is substantially normal to a direction of said driving. Also, the driving preferably further causes precessing of the substrate with respect to the substrate carrier.

A substrate carrier which employs a containment barrier having an inner boundary adapted to fit snugly with a perimeter of the substrate is also provided. This containment barrier is dimensioned and adapted to precess with respect to a carrier plate during polishing. A gap exists between the inner boundary of the containment barrier and an outer perimeter of the carrier plate to allow precessing movements. The containment barrier may be movably mounted to a carrier mount to allow lateral movement with respect thereto. A fluid bearing, preferably an air bearing may be established between the carrier mount and the containment barrier to allow precessing movements.

Another method of polishing a substrate is described as capturing a substrate within an inner perimeter of a containment barrier so that the substrate is not free to rotate with respect to the containment barrier; applying a polishing motion to the substrate through the containment barrier and a carrier plate positioned above the substrate; and allowing the substrate and the containment barrier to precess with respect to the polishing movements of the carrier plate.

Additional advantages of the present invention will become apparent upon reading the following detailed disclosure and claims.

BRIEF DESCRIPTION OF THE DRAWINGS

FIG. 1 is a sectional view of a first embodiment of a carrier head according to the present invention.

FIG. 2 is a graph of a pressure profile applied to a substrate by the carrier in FIG. 1.

FIG. 12A is a bottom view of another embodiment of a carrier plate 355 according to the present invention.

FIG. 12B is a sectional view of groove 662 taken along section lines XII—XII in FIG. 12A.

FIG. 12C is a magnified view of the portions of grooves 662 outlined at 668 in FIG. 12A.

FIG. 16A is a sectional view of another embodiment of a carrier plate according to the present invention.

FIG. 16B is an enlarged view of the portion of FIG. 16A outlined by line XVI.

BEST MODE FOR CARRYING OUT THE INVENTION

Figure 3:
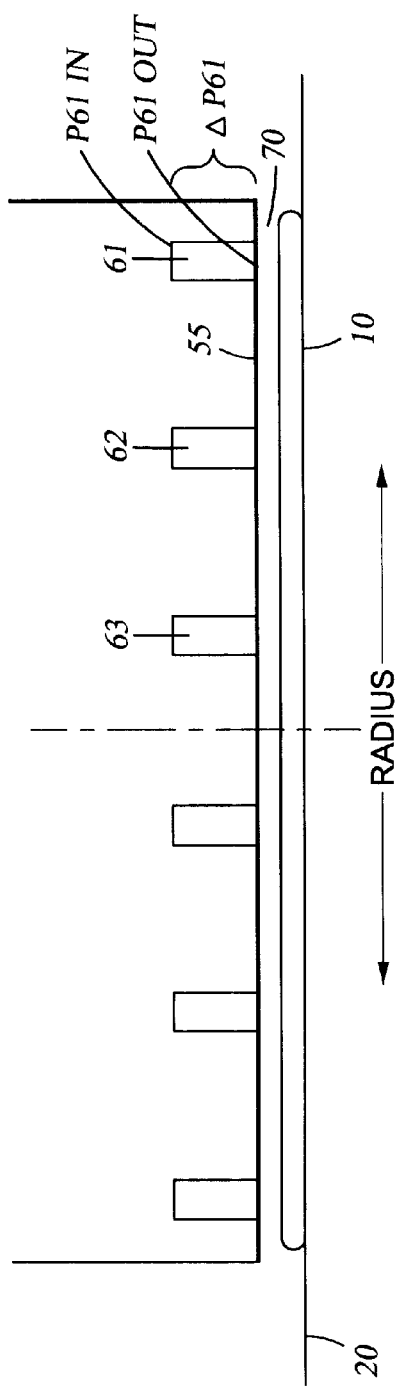
FIG. 3 is a sectional illustration of a carrier applying a varied pressure profile to the back surface of a substrate.

A polishing force against a substrate is generally generated by a load against the backside of a substrate to be polished, in addition to a force applied to drive at least one of the substrate to be polished and the polishing media against which a surface of the substrate is polished. The present invention is directed towards improving the application of the load against the backside of the substrate, to prevent the generation of anomalies, prevalent in current designs, which are due directly to the load application, as well as those that are generated in combination with the driving load.

FIG. 1 schematically shows a partial sectional view of a substrate carrier 50 employing load application principles according to the present invention. The carrier 50 includes force applicator(s) 60 through which a force or forces P are applied to the backside of a substrate 10 to be polished against a polishing media 20. The polishing media may be a slurry or slurryless type of pad or web. Relative movement between the polishing media 20 and substrate 10, in combination with the force applied to the backside of the substrate 10 effects the polishing of the front side of the substrate.

The plate 55 of the substrate carrier 50 forms an upper reference plane from which the force applicator(s) 60 apply the load to the substrate 10. In this example, the force applicators include three concentric rings 61, 62 and 63 which are configured to emit controlled flows of gas and/or liquid. Preferably, the applicators 61, 62 and 63 emit air to form a pressurized air layer 70 between the plate 55 and the substrate 10. However, other gases, water, a mixture of water and air and/or other gases, or vacuum may also be employed in forming a bearing layer 70 between plate 55 and substrate 10. Of course, this type of carrier is not limited to the use of three rings, but may use four rings or more, or even one or two rings. Still further, the entire plate 55 may be formed of a porous material. A greater number of rings give a finer control over the pressure profile that can be applied to the backside of the substrate, but of course, is more complicated and costly to build On the other hand, two or one ring embodiments are simpler and cheaper, but offer less control and variability of the pressure profile. Optionally, a pressurized chamber 51 may be included above the plate 55 to apply a primary force P' against the entire plate 55, or a portion thereof.

In one embodiment of a three ring arrangement using pressurized air, the "flying height" (i.e., the distance between plate 55 and the backside of substrate 10) of the carrier 50 is about 2 to 25 $\mu$m, more preferably about 3 to 10 $\mu$m, with preferred flow rates of about 4–6 ft$^3$/hr through ring 61, about 2–2.5 ft$^3$/hr through ring 62 and about 2–4 ft$^3$/hr through ring 63, when the rings are metallic. When the rings are plastic, the preferred flow rates are about 5–100 ft$^3$/hr through ring 61, about 2–10 ft$^3$/hr through ring 62 and about 2–10 ft$^3$/hr through ring 63. By metering or regulating the pressure supplied to the rings, the flying height of the substrate can be tuned or adjusted.

The flow rate through a porous ring or other orifice according to the present invention is substantially inversely proportional to the pressure drop across that ring or other orifice. The pressure drop can be represented by the equation: $\Delta P = P_{in} - P_{out}$; where $\Delta P$ designates the pressure drop, $P_{in}$ represents the pressure of the gas/fluid inputted to the ring or other orifice, and $P_{out}$ represents the pressure of the gas/fluid outputted from the ring or other orifice.

Thus, a reduction in $\Delta P$ is synonymous with an increase in air flow through which consequently increases the flying height, i.e., the distance between the surface of the carrier 55 and the backside of the substrate 10. An increase in the flying height also lowers the stiffness (K) of the bearing which applies the pressure P to the backside of the substrate 10.

By positioning the restrictor (the outermost ring) close to the edge of the plate, the edge polishing parameters can be adjusted to achieve finer edge exclusion. Of course, the flow rates are adjustable outside of the preferred ranges in order to vary the pressure profile that is applied to the substrate, as will be described below.

The rings are preferably formed by making grooves in the plate 55 and filling the grooves with a microporous material. The rings may be manufactured may be conventionally machined, cast, or formed by wire electric discharge machining (i.e., wire EDM) and are preferably formed by wire EDM. However, other configurations of the pressure applicators are possible and will be discussed in greater detail below. Each ring is independently controllable as to the pressure/flow of gas/liquid emitted therefrom. Supply tubes 81, 82 and 83 are connected to the respective rings 61, 62 and 63 and each leads externally of the carrier 50 and connects with a controllable air/liquid supply (not shown) which may be manually or computer controlled.

When the rings 61, 62 and 63 are set to deliver an equal flow rate/ pressure of air/liquid, a constant pressure profile is formed in the layer between the plate 55 and backside of the substrate 10, as shown in FIG. 2. Additionally, the outermost ring 61 can be formed very close to the edge of the faceplate 55 to enable the pressure wave to extend at a substantially constant value nearly to the edge of the faceplate. The bearing layer 70 further enables the substrate to "float" or precess with respect to the faceplate 55, since the faceplate 55 does not contact the backside of the substrate once the layer 70 has been formed. The radius of the substrate 10 is somewhat smaller than that of the faceplate, and the substrate is maintained in position between the faceplate 55 and the polishing media 20 by the presence of containment ring 80.

The combination of the ability to apply substantially uniform load pressure over the entire surface of the backside of the substrate with the ability to allow the substrate to precess or float within the confines of the containment ring results in a very uniform polishing process that removes material consistently from the edge of the substrate to the center. At this time, it should be mentioned that the faceplate and containment ring, although preferably circular, are not to be limited to such a shape. For example, the faceplate and containment ring could be formed to have oval, elliptical or various other conforming shapes. Nor do the rings need to be circular, as exemplified in the embodiment shown in FIG. 12B and described below, for example.

Figure 4:
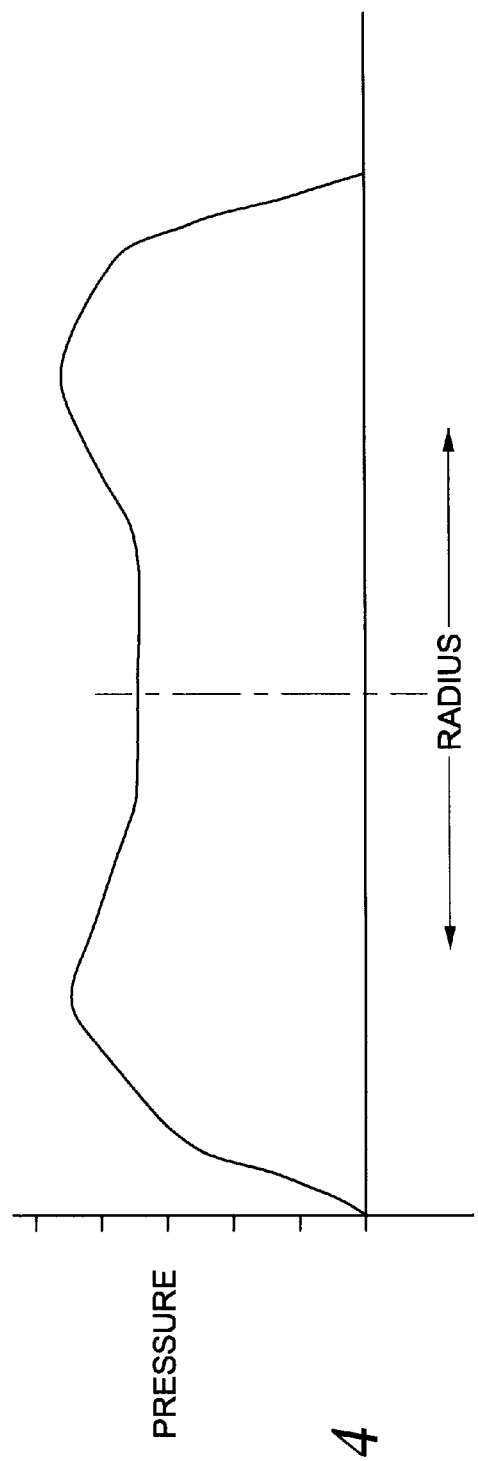
FIG. 4 is a graph of the resultant pressure profile applied to the substrate by the carrier in FIG. 3.

Alternatively, in situations where shaping or conformation of the pressure profile is required, the flow through the rings 61, 62 and 63 can be varied to achieve the desired conformation of the pressure profile. For example, FIGS. 3 and 4 show control of the rings (FIG. 3) to emit about 3 psig from ring 61, about 5 psig from ring 62 and about 4 psig from ring 63 and the resultant air pressure profile experienced by the backside of a substrate (FIG. 4). This type of profile would be used in a situation where the least amount of polishing is desired at the edge of a substrate, with somewhat more polishing desired in the center of the substrate, and with the greatest rate of polishing desired in between the edge and the center of the substrate. Of course, other profiles can be shaped as desired.

Preferably, the process of polishing according to the present invention includes moving at least one of the carrier, and polishing surface against which the substrate is polished, relative to the other in a nonlinear path while maintaining substantially constant instantaneous relative velocity between the polishing medium and all points on the carrier. However, the apparatus of the present invention is not limited by type of polishing motion and could be used for example to polish a substrate by rotating the carrier against a rotating polishing surface. Examples of some of the more preferred polishing techniques and apparatus for performing the same are described in copending U.S. application Ser. No. 08/961,602, filed Oct. 31, 1997, and U.S. Pat. No. 5,759,918, both of which are incorporated by reference herein in their entireties. Additional polishing techniques are disclosed in a copending application filed concurrently herewith, titled "Polishing Media Stabilizer". This application is also incorporated herein in its entirety, by reference thereto.

As an example, after loading the substrate 10 between the polishing surface 20 and carrier 50, pressurized gas, e.g. pressurized air is injected through rings 61,62,63 as described herein, to create a bearing layer between the substrate carrier 50 and a back side of the substrate 10, such that the back side of the substrate does not contact the substrate carrier. At least one of the substrate carrier 50 and polishing surface 20 are then driven to effect a polishing action between a front side of the substrate 10 and the polishing surface 20. The pressurized gas exerts a polishing force that is substantially normal to the directions of polishing and which acts to force the substrate against the polishing surface.

The bearing layer produced by the injection of pressure gas as described above, allows free floating of the substrate with respect to the carrier, within the bounds of ring 80. This free float ability, combined with the driving motions of the carrier and/or polishing surface and the boundary created by the ring 80, produces a controlled precession motion of the substrate during polishing. The characteristics of the precession motion can be controlled by controlling the shapes and speeds of the polishing path of the carrier with respect to the polishing surface.

Figure 5:
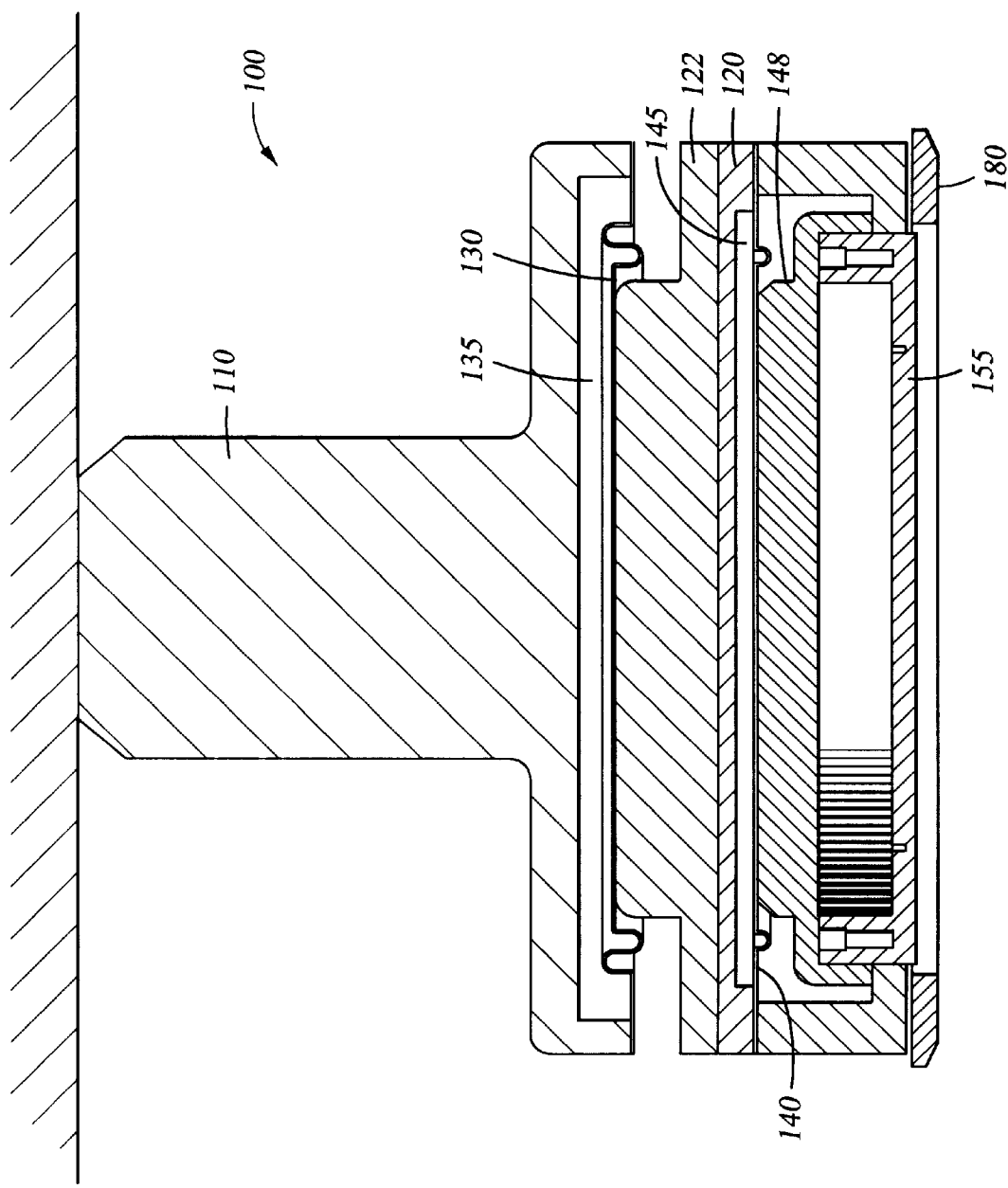
FIG. 5 is a sectional view of a carrier according to the present invention.

FIG. 5 shows a first arrangement 100 for control of the containment ring pressure and control of the gross pressure on the face plate, according to the present invention. In this arrangement, the carrier plate 155 is mounted to a carrier loading column 110, via seal plates 120, 122. A first diaphragm 130 is mounted between the seal plate 122 and the carrier loading column 110 to form an upper pressurizable chamber 135. A second diaphragm 140 is mounted between seal plate 120 and the carrier plate 155 to form a lower pressurizable chamber 145.

The location of the carrier loading column 110 forms the basis for gross positioning of the carrier. The upper pressurizable chamber 135 is pressurized to distend diaphragm 130 by a desired amount to advance both the containment ring 180 and the carrier plate 155 toward the substrate and the polishing media. Upper pressurizable chamber 135 provides the primary load control of the containment ring 180 which provides side load bearing control of the substrate during polishing.

Pressurization of the chamber 145 results in a distention of the diaphragm 140 against the carrier plate seal ring 148 which further advances, by secondary control, the carrier plate 155. After positioning the containment ring 180 and carrier plate 155 as described above, the bearing layer 70 is generated as described above and may be controlled and shaped as necessary. Additional or less force to the containment ring 180 and/or carrier face plate may be adjustably controlled when and as necessary.

Figure 6:
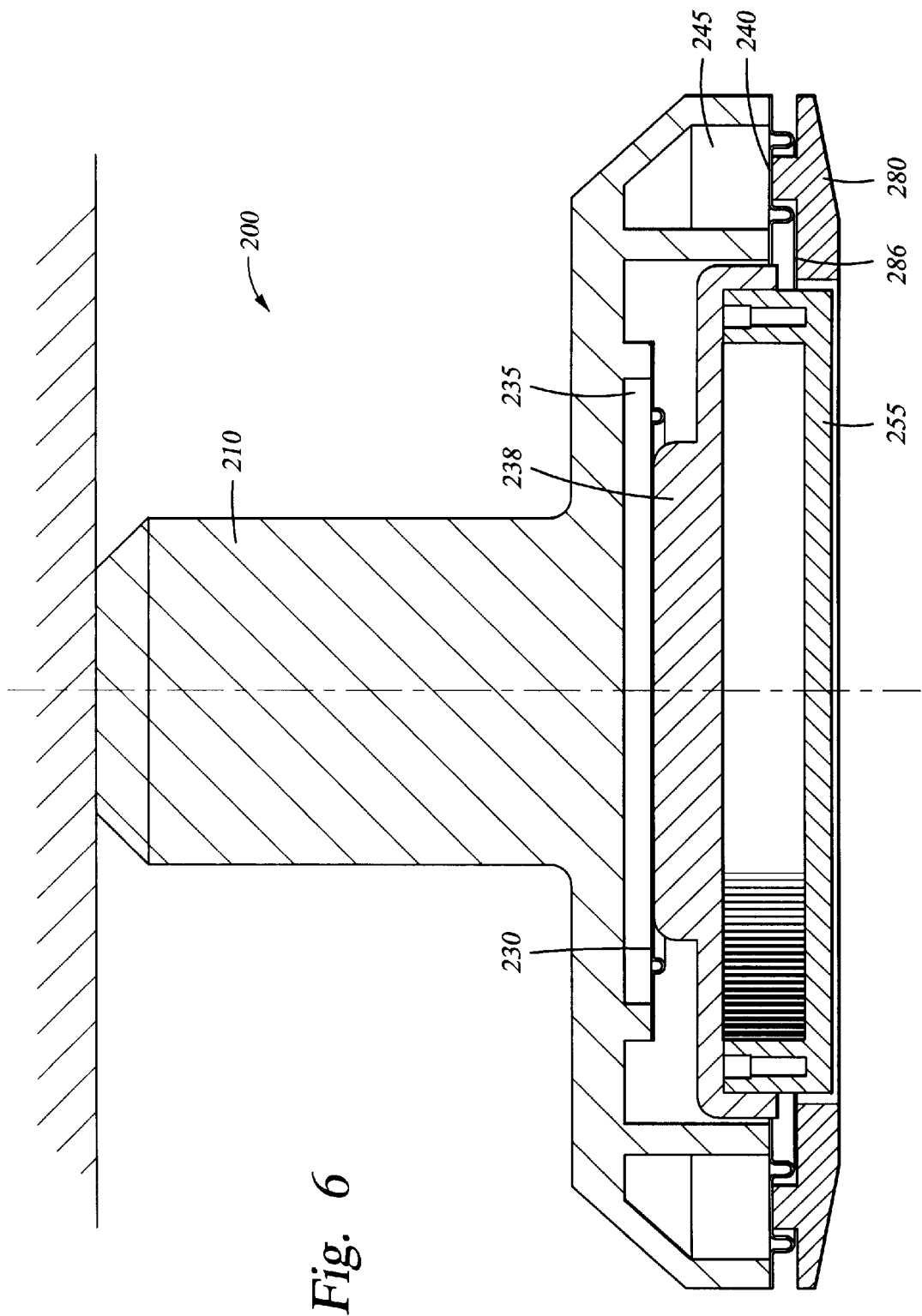
FIG. 6 is a sectional view of another embodiment of a carrier according to the present invention.

An alternative arrangement for control 200 is shown in FIG. 6, in which the carrier plate is primarily controlled by an upper pressure chamber 235 formed between an upper diaphragm 230 and the carrier loading column 210. Pressurization of chamber 235 causes a distention of diaphragm 230. Distention of the diaphragm 230 moves the carrier plate seal ring 238 away from the carrier loading column 210, and, consequently displaces the carrier plate 255 toward the substrate and the polishing media.

In this arrangement, the containment ring is controllable independently of control of the carrier plate 255, by pressurization of the chamber 240. Pressurization of chamber 240 causes distention of the diaphragm 245 which in turn distends the ring 280 with respect to the carrier plate 255. Thus, additional pressure can be applied through the containment ring 280 to the polishing media without affecting the load on the carrier plate 255.

Figure 7:
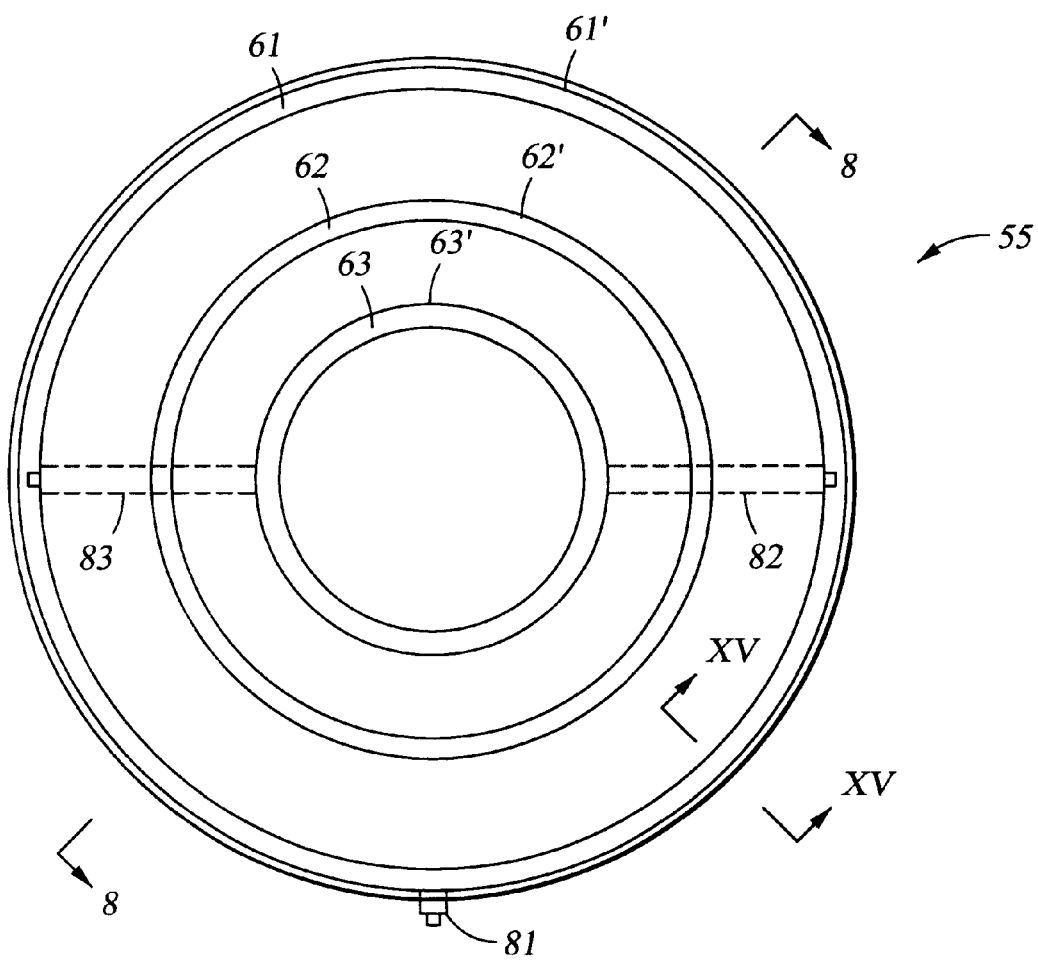
FIG. 7 is a bottom view of one embodiment of a carrier plate 55 according to the present invention.

FIG. 7 is a bottom view of an embodiment of a carrier plate 55 according to the present invention. The plate 55 is generally formed of a relatively strong, relatively non-corrosive metal such as cast aluminum or stainless steel. Grooves 61', 62' and 63' are formed in the plate 55 for receiving rings 61, 62 and 63, respectively. In one example, the rings are approximately 3/32" thick. However, an optimum thickness has not been determined and there appear to be no restrictions as to thickness from a performance standpoint. Ultimately, manufacturing considerations may dictate a preferred thickness or range of thicknesses. The grooves may be conventionally machined, cast, or formed by plunge electric discharge machining (i.e., plunge EDM) and are preferably formed by plunge EDM. The rings are formed of a microporous material which will pass the desired medium (e.g., air, water, mixture, etc.) but at the same time act as a restrictor that forms a sufficient pressure drop between the back side of the carrier plate 55 and the face of the carrier plate 55 to float the substrate 10.

The microporous material may be made of POREX® or other substantially equivalent porous polyethylene, microporous bronze, microporous titanium, microporous stainless steel, microporous gold, microporous ceramics or other substantially equivalent microporous materials. Preferred materials are microporous stainless steel, especially when the carrier plate is made of stainless steel, or microporous polyethylene, particularly POREX®. POREX® is particularly attractive because of its low cost and may even be used to form a "disposable" carrier plate in which the carrier plate itself is made of a relatively wear resistant polymer such as polyphenko ertalyte or DELRIN®. POREX® is also preferable for use with metal carrier plates as described above, due to the relatively lower cost of the polymers compared to the metals.

Figure 8:
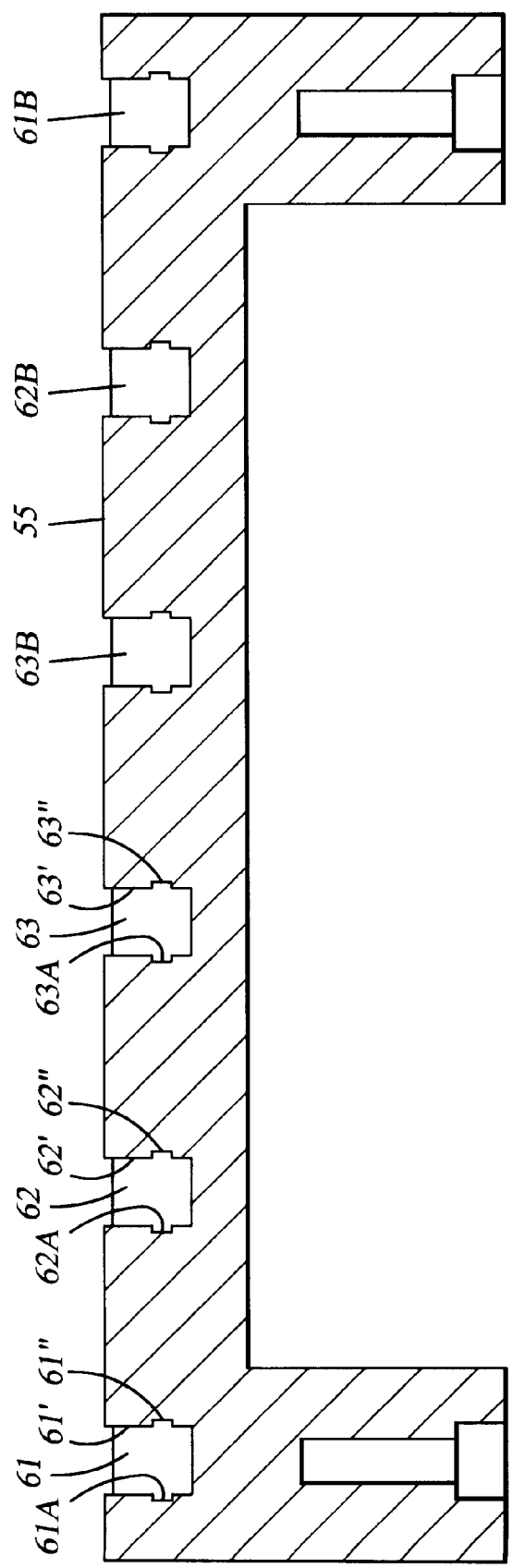
FIG. 8 is a cross-sectional view, taken along line 8—8, of the carrier plate shown in FIG. 7.

The rings 61, 62 and 63 are preferably press fit into the grooves 61', 62' and 63', respectively. In the case of microporous polymer rings, locking grooves 61", 62" and 63" are formed within the grooves 61', 62' and 63', respectively, as shown in the cross-sectional view of FIG. 8. The microporous polymer rings 61, 62 and 63 are compressible and can therefor be formed with locking collars 61a, 62a and 63a, respectively. The rings are compressed for insertion into the grooves and then released once in position. Upon re-expansion of the rings, the collars 61a, 62a and 63a, seat within the locking grooves 61", 62" and 63", respectively, thereby locking the rings in position in the respective grooves.

It is further preferable, when using porous polymeric rings, to recess the faces of the rings 61b, 62b and 63b by about 0.001" with respect to the face of the carrier plate 55, to ensure that the rings do not protrude beyond the planarity of the face of the carrier plate 55. Rings which are recessed 0.001" do not appreciably effect the polishing results from that carrier. On the other hand, if one or more rings or portions thereof extends from the planar face of the carrier plate, a substantial anomaly in polishing results will be evident.

Referring back to FIG. 7, supply tubes 81, 82 and 83 are shown passing into the carrier plate and connecting to the respective rings 61, 62 and 63 for external connection thereof with a controllable air/liquid supply (not shown) which may be manually or computer controlled.

Figure 9:
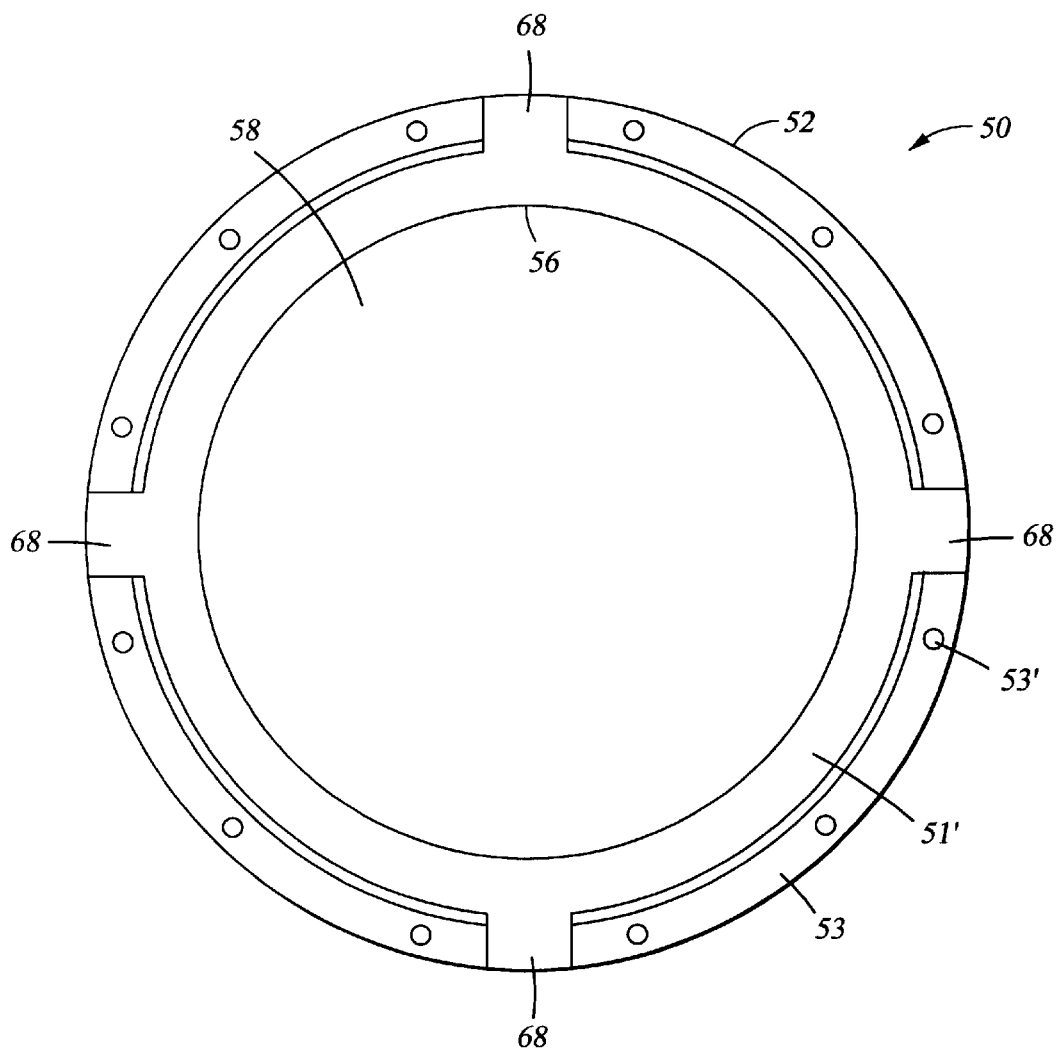
FIG. 9 is a bottom view of a carrier plate mount 52 of the carrier 50, having had the carrier plate 55 removed.

FIG. 9 is a bottom view of a carrier plate mount 52 of the carrier 50, having had the carrier plate 55 removed. The carrier plate mount 52, like the carrier plate 55, is also preferably made of cast aluminum or stainless steel. The carrier plate mount 52 is centrally recessed 56 in this example to receive a bladder 58 that can be inflated/distended to function as the primary driver of the carrier plate 55 as described above.

A step or shoulder 51 is formed circumscribing the recess 56 for supporting the carrier or bearing plate 55, thereby preventing the bearing plate 55 from retracting too far into the carrier to the extent that damage of the bladder 58 might occur. Access grooves 68 are provided through ring mount 53 at the level of the shoulder 51. The access grooves 68 permit access of the supply tubes 81, 82 and 83 without deformation upon mounting of the ring 80 to the ring mount 53. The order of assembly of the carrier includes alignment of the supply tubes 81, 82 and 83 with respective access grooves 68 and then placement of the carrier plate 55 on the shoulder 51. After properly placing the carrier plate 55, the ring 80 is next affixed to the ring mount 53 preferably using studs, bolts or screws in mounting holes 53'.

Figure 10:
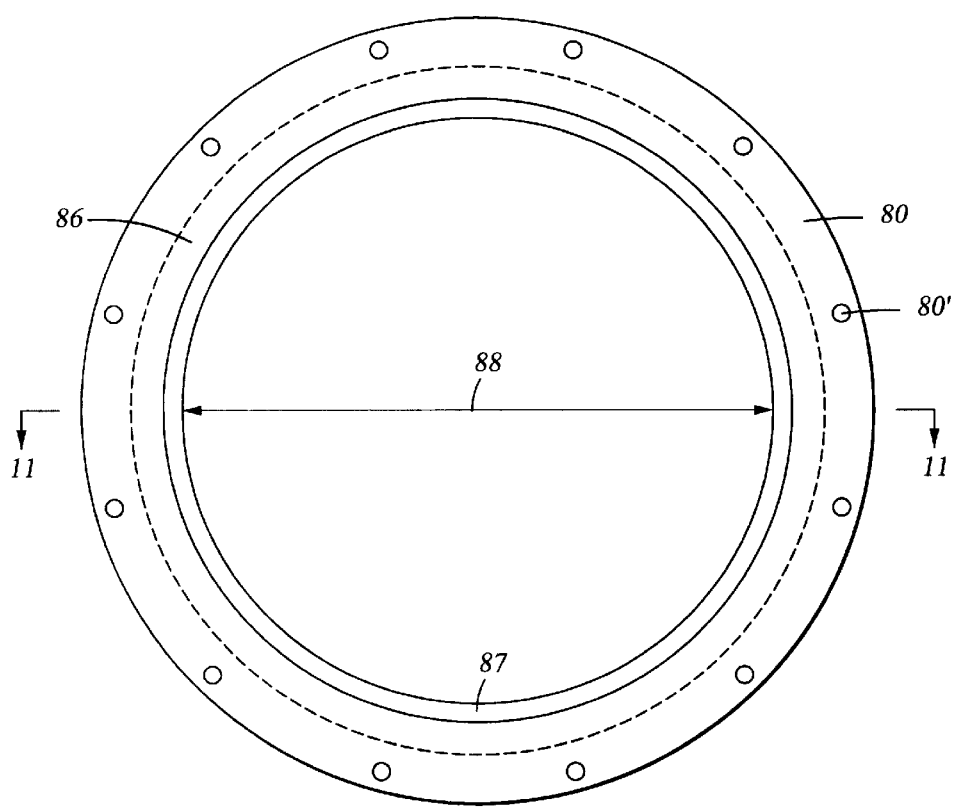
FIG. 10 shows a bottom view of an exemplary ring or containment ring 80.

An exemplary ring or containment ring 80 is shown from a bottom view in FIG. 10. Containment ring 80, when installed on the carrier 50, supplies the appropriate horizontal forces necessary to horizontally bias the substrate to be polished so as to ensure that the substrate remains positioned between the carrier 50 and the polishing surface when one or both of the carrier 50 and polishing surface are moving with respect to the substrate. Additionally, as designed herein, the inside diameter 88 of the ring 80 is sufficiently greater than the diameter of the substrate to be polished so as to effect a precessing of the substrate, within confines of the containment ring 80, as the carrier 50 is orbited or otherwise moved through its polishing pattern with respect to the polishing surface. Of course, the same effect can be obtained through moving the polishing surface with respect to the carrier 50, and also a combination of movements of the carrier and polishing surface can effect results as well.

The containment ring 80 is generally made of a material having good dimensional stability, wear properties, and energy absorbing properties. For example, the containment ring 80 may be made from POLYPHENKO ERTALYTE (PPE) or DELRIN®, or similar material, preferably PPE.

Figure 11:
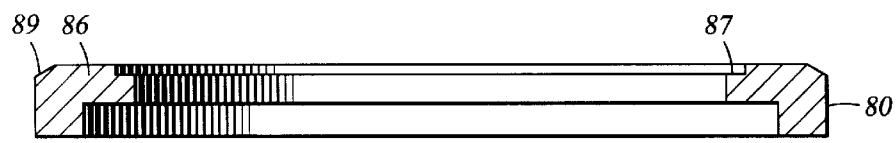
FIG. 11 is a cross-sectional view, taken along line 11—11, of the ring shown in FIG. 10.

The containment ring 80 has a ledge portion 86 around the inner circumference thereof which has an inner diameter that is only slightly larger than the outer diameter of the plate 55,155,255 of the substrate carrier so as to form an outer boundary thereof, within which the substrate being polished is contained as it precesses and is polished. The ring 80 is preferably tapered by an angular cut 89, or molded or otherwise formed to this conformation, along its outside circumference as shown in the cross sectional view in FIG. 11. Additionally, it has been found to be preferable to form a slight undercut or countersink 87 in the ledge portion 86 as shown in FIG. 11. It is believed that this undercut 87 allows a more even and constant air/fluid flow over the entire polishing surface defined by plate 55,155,255 and particularly along the edge boundaries.

The ring 80 includes mounting holes 80' spaced to align with mounting holes 53'. After properly placing the carrier plate 55 as described above, the ring 80 is next affixed to the ring mount 53 by alignment of holes 80' and 53' and affixing the components, preferably using studs, bolts or screws in mounting holes 53'. Once assembled, the ring 80 allows free vertical movement of the carrier plate 55, but prevents the carrier plate from distending too far downward or falling out of the assembly by contact between the carrier plate seal ring and ledge portion (e.g., 238 and 286, respectively, in FIG. 6).

FIG. 12A is a bottom view of another embodiment of a carrier plate 355 according to the present invention. The plate 355 is generally formed of a relatively strong, relatively non-corrosive metal such as cast aluminum or stainless steel. Grooves 361', 362' and 363' are formed in the plate 355. Ring 361 is fitted (preferably press fitted) into the groove 361'. The grooves may be conventionally machined, cast, or formed by plunge electric discharge machining (i.e., plunge EDM) and are preferably formed by plunge EDM. The ring 361 is formed of a microporous material which will pass the desired medium (e.g., air, water, mixture, etc.) but at the same time act as a restrictor that forms a sufficient pressure drop between the back side of the carrier plate 355 and the face of the carrier plate 355 to float the substrate 10.

In this embodiment, the ring is preferably made of porous bronze, although any of the other materials previously described for making porous rings may alternatively be employed. This embodiment is designed to emit a pressurized flow of air, water, other fluid or mixtures thereof (preferably pressurized air) from ring 361. A port 364 is provided to draw vacuum through groove 363'. In between ring 361 and groove 363', groove 362' is open to atmospheric pressure and forms a boundary layer between the pressure emitted from ring 361 and the vacuum drawn by groove 363'.

Supply tubes 381, 382 and 383 are shown passing into the carrier plate 355 and connecting to the respective grooves 361', 362' and 363' for external connection thereof with a controllable air/liquid supply (not shown) which may be manually or computer controlled. Specifically, supply tube 381 connects to an external controllable pressure source, supply tube 383 connects to an external controllable vacuum source and supply tube 382 is open to the atmosphere.

FIG. 12A is a bottom view of another embodiment of a carrier plate 655, for purposes of illustrating that many different designs/styles of carrier plates can be designed to meet the inventive concepts discussed herein. In this embodiment, the main flow of the pressurized fluid is conducted through openings 661 and the flow is preferably spatially extended through grooves 662. Openings 663 are provided around a locus of a circle positioned radially inwardly from the openings 661 and are adjustable to provide biasing of the fluid layer against the substrate. Grooves 665 are preferably provided to spatially extend the pressure flow from the openings 663. Preferably, the area surrounded by the imaginary circle connecting the openings 663 is about the same as the area surrounded by the imaginary circle connecting the openings 661 minus the area surrounded by the imaginary circle connecting the openings 663.

Vacuum/blow off openings 670 are provided radially inwardly of the openings 663. Vacuum may be drawn through openings 670 to pick up the substrate after a polishing procedure or to pick up the substrate anytime a polishing procedure is not occurring. Additionally, a pressurized flow can be passed through the openings 670 to blow off the substrate after picking it up and moving it to a location that the substrate is to be placed. Optionally, grooves 672 (shown in phantom) may be placed to spatially extend the vacuum/pressure applied through some or all of the openings 670. Also, the openings 670 are preferably, but not necessarily, staggered so as to lie along two imaginary concentric circles, as shown in FIG. 12A.

FIG. 12B is a cross sectional view, taken along section line XII—XII, of one of the grooves 662 extending from openings 661 in FIG. 12A. The groove is preferably radiused at the bottom, to help prevent accumulation of slurry or other unwanted accumulation of materials therein. The depth 662' of groove 662 is preferably substantially equal to the width 662" thereof.

FIG. 12C is a detailed view of the insert 668 shown in FIG. 12A. FIG. 12C shows the spacing that exists between adjacent grooves 662. Grooves 662 are also preferably radiused at their ends to help prevent unwanted accumulations of slurry, etc. The gap 667 between grooves 662 is preferably at least twice the width 662" and may be as great as the distance between openings 661, e.g., when no grooves are provided. The width 662" is preferably at least about 0.007" and as great as about 0.035". Preferably, the grooves 662 have a length less than or equal to about fifty times the width 662".

Figure 13:
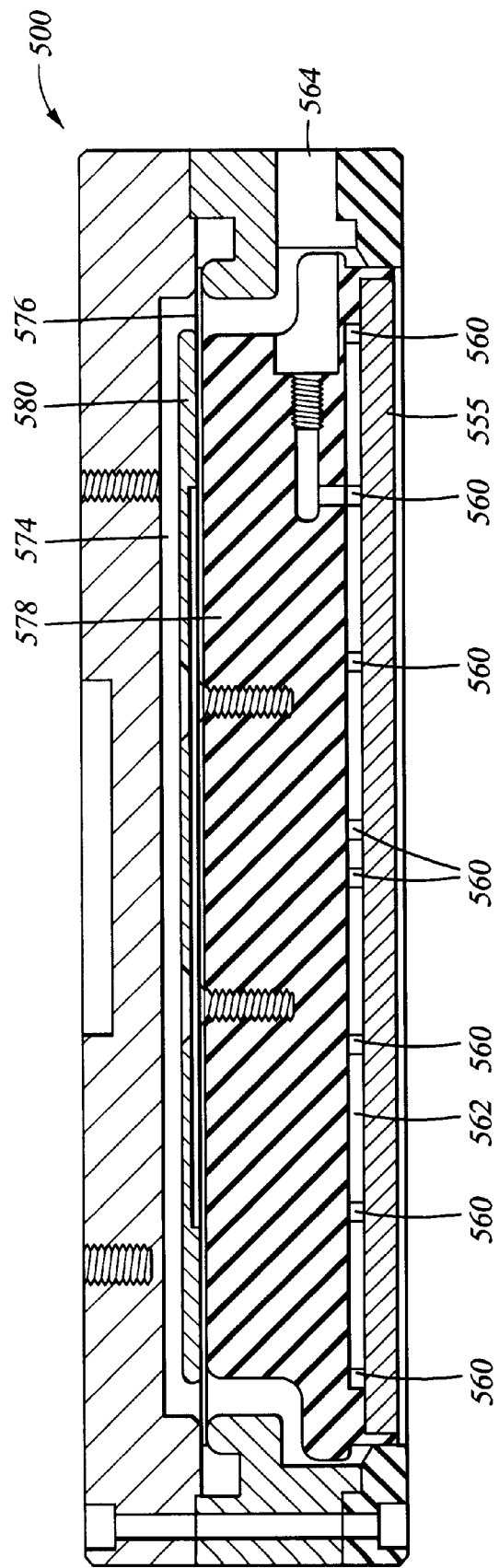
FIG. 13 is a sectional view of an embodiment of a carrier head 500 having a carrier plate 555 which is porous over substantially the entire surface thereof.

FIG. 13 is a sectional view of an embodiment of a carrier head 500 having a carrier plate 555 which is porous over substantially the entire surface thereof. The plate 555 is preferably formed of POREX® or other substantially equivalent porous polyethylene having a porosity from about 5 $\mu$m up to about 100 $\mu$m, preferably ranging from about 5 $\mu$m to about 10 $\mu$m, but could be constructed of microporous bronze, microporous titanium, microporous stainless steel, microporous gold or other substantially equivalent microporous materials. POREX® and other porous polyethylenes are particularly attractive because of their relatively low costs.

When constructed of microporous bronze, microporous titanium, microporous stainless steel, microporous gold or other substantially equivalent microporous materials, the overall porosity of the porous plate 555 is defined by an average porosity of about 0.2–100 $\mu$m, preferably from about 0.2 to about 10 $\mu$m±10%. The preferred porosity characteristics allow an air flow of about 80–110 ft$^3$/hr at a feed pressure of 60–70 psi, with a preferred flow rate of 100 ft$^3$/hr±5% at a feed pressure of about 70 psi.

Ports 560 connect the porous plate 555 with an external source of pressurized air, fluid or combination. Preferably a source of pressurized water or water and air is employed in this embodiment, although other chemical fluid mixtures are another possibility. A channel or channels 562 are located between the plate 555 and carrier plate seal ring 578 to connect the ports 560 to supply input 564. The supply input connects to an external controllable source of pressurized air, fluid, or combination thereof, which may be computer or manually controlled.

Optionally, a metallic backing plate 580 may be mounted to the back surface of carrier plate seal ring 578 to help even the pressure distribution of the primary driving force down upon the carrier plate seal ring. The metallic backing plate is preferably made of aluminum or stainless steel. A pressure membrane 576 is provided to form a pressure chamber 574 to generate the force that is applied to carrier plate seal ring 578.

Figure 14A:
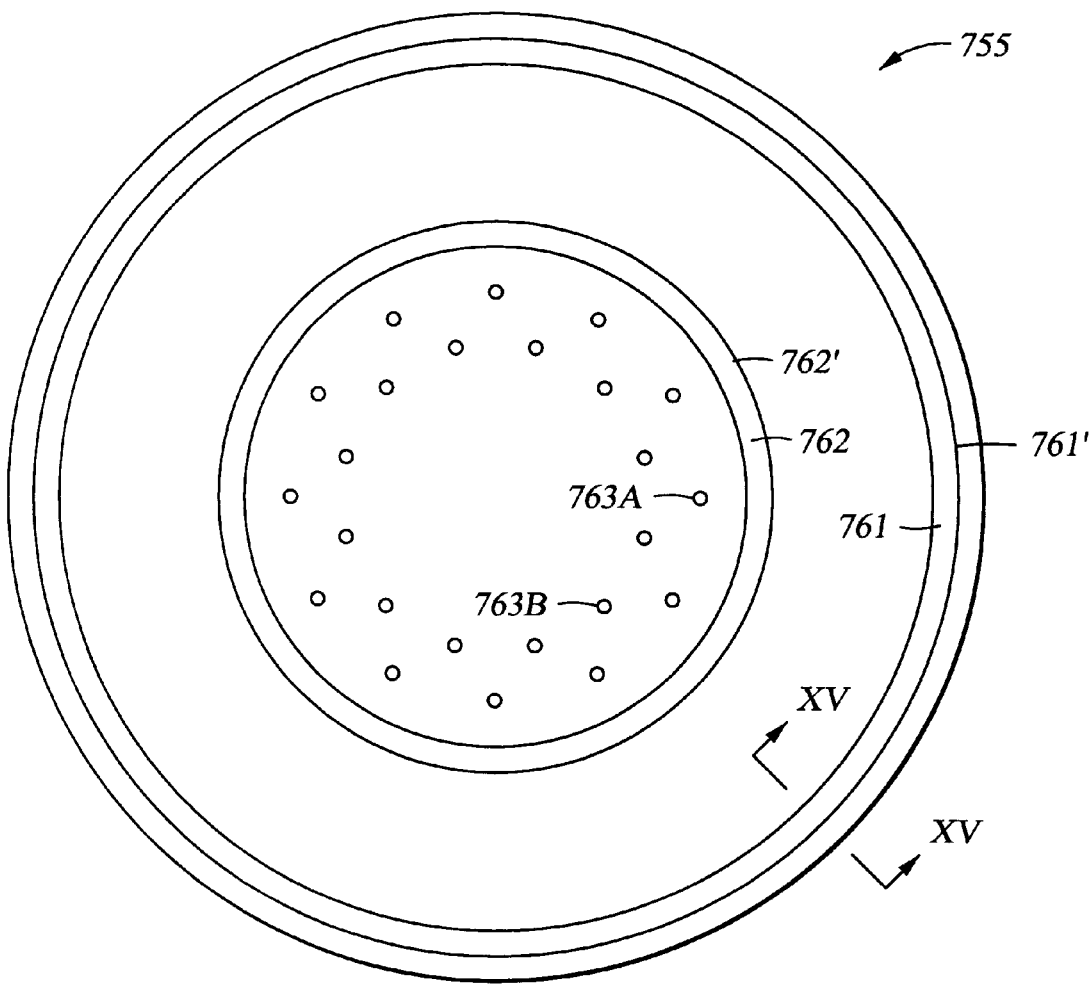
FIG. 14A is a bottom view of another embodiment of a carrier plate 755 according to the present invention.
Figure 14:
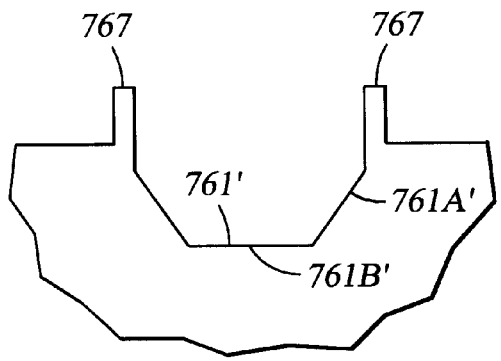
FIG. 14B shows one embodiment of a cross sectional shape of groove 761', taken along section lines XV–XV in FIG. 14A.
FIG. 14C shows another embodiment of a cross sectional shape of groove 761', taken along section lines XV—XV in FIG. 14A.
FIG. 14D is a sectional view of ring 761 fitted in the embodiment of groove 761' shown in FIG. 14C.
Figure 14:
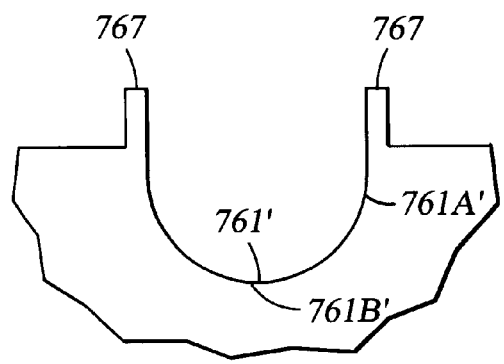
Figure 14:
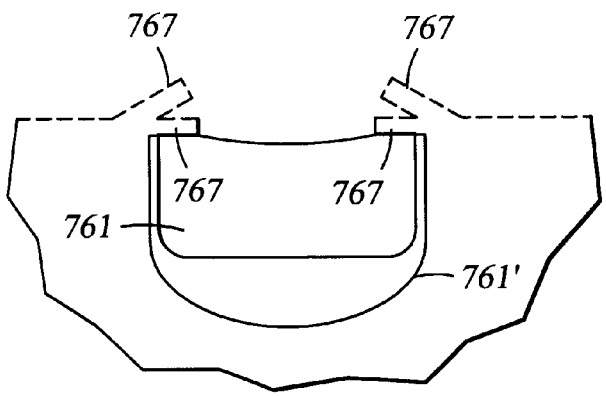

FIG. 14A is a bottom view of another embodiment of a carrier plate 755 according to the present invention. The plate 755 is generally formed of a relatively strong, relatively non-corrosive metal such as cast aluminum or stainless steel. Grooves 761' and 762' are formed in the plate 755 for receiving porous rings 761 and 762, respectively. In one example, the rings are prepared from microporous stainless steel supplied by High Purity Supplies, Fremont, Calif., which is a distributor for Mott Metallurgical Corp., Farmington, Conn. In this example the porosity is about 0.5 $\mu$m. However, the microporous material may be made of other substantially equivalent porous materials, such as microporous bronze, microporous titanium, microporous gold, microporous ceramics, POREX® or microporous polyethylene. Also, the porosity of the rings may be selected from a range of about 0.2 $\mu$m to about 100 $\mu$m in the case of the microporous metals and ceramics, and about 5 $\mu$m to about 100 $\mu$m for microporous polymers.

The grooves may be conventionally machined, cast, or formed by plunge electric discharge machining (i.e., plunge EDM) and are preferably formed by plunge EDM, as noted above. The rings are formed by machining, lapping, and then electropolishing to open the pores back up which have been closed over by the machining and lapping stages.

FIGS. 14B and 14C show two different cross sectional shapes, among others, taken along section lines XV—XV in FIG. 14A, that the groove 761' may be formed to have. Although the grooves can be formed as square channels, it is preferred that the angles between the bottom wall 761b' and side walls 761a' are at least obtuse, and a semicircular channel, as shown in FIG. 14C is even more preferred. The main reason for the preference is to avoid any crevices that may accumulated slurry, etc, The same design considerations apply equally to groove 762'.

The plate 755 is machined or otherwise formed to have a lip 767 adjacent each side wall of the groove 761' (as well as the groove 762', although not shown). After formation of the ring 761 as described above, the ring 761 is next press fit into the groove 761' as shown in FIG. 14D, the ring having been machined and finished for press fitting within about a 0.001" to about 0.003" tolerance. After press fitting, the entire plate 755 is pressed to deform the lips 767 which form physical stops that will prevent any lifting of the rings out of their positions within the grooves.

In this embodiment, the main flow of the pressurized fluid is conducted through ring 761, with a flow rate ranging from about 30 to about 100 cubic feet per hour, more preferably about 50 to 90 cubic feet per hour, and still more preferably about 60 to 70 cubic feet per hour. The flow through the inner circle ring 762 is much lower, preferably about −3 to 3 cubic feet per hour. At least one orifice (not shown) is provided for each of the grooves 761' and 762' and connected to a pressurized fluid source so as to supply an independently controlled flow of pressurized fluid to each of the rings 761, 762.

Openings 763a and 763b are provided along two concentric imaginary circles, respectively, adjacent and radially inward of groove 762'. Openings 763a and 763b are connected to at least two ports for connection to a vacuum/pressure source to provide vacuum/blow off functions similar to that described above with regard to reference numeral 670 in FIG. 12A. At least two ports are preferred so that flushing of the openings may be performed to help prevent any clogging of the openings 763a,763b.

Figure 15:
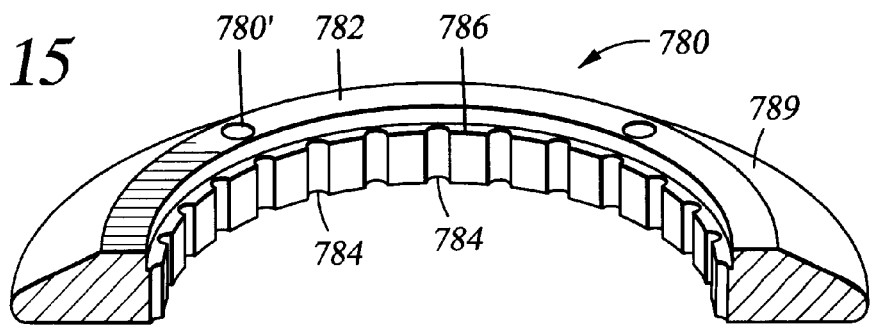
FIG. 15 shows another embodiment of a containment ring according to the present invention.
Figure 17:
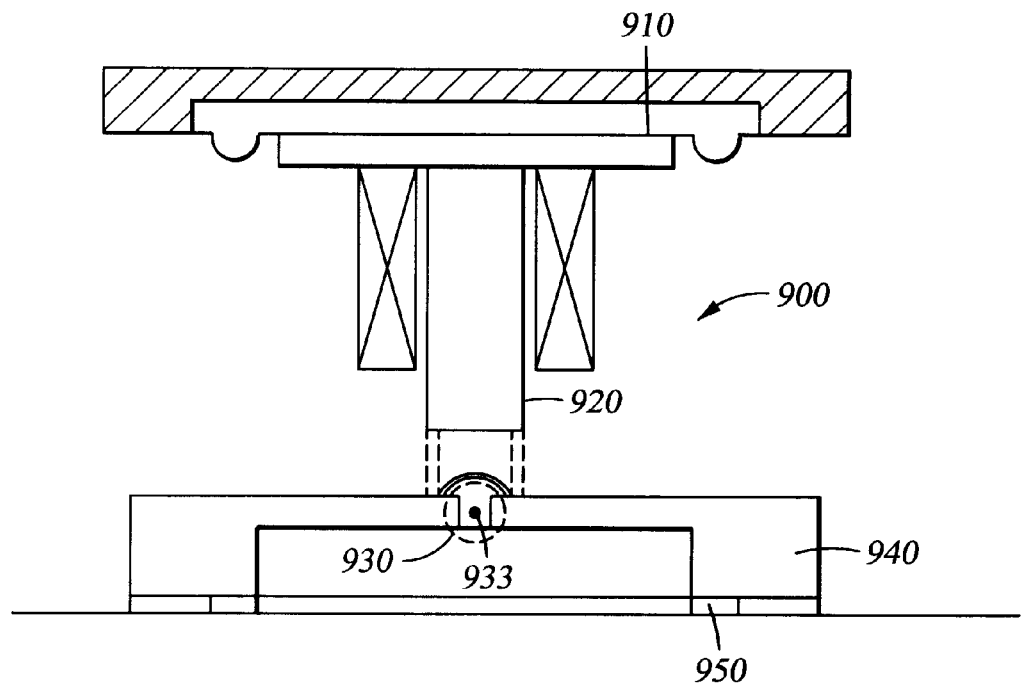
FIG. 17 is a schematic sectional view of a prior art device illustrating certain disadvantages thereof.
Figure 18:
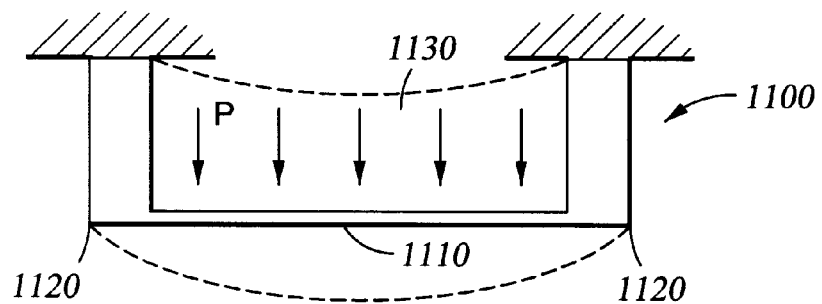
FIG. 18 illustrates a problem inherent in a prior art carrier 1100 having a deformable plate 1110.

FIG. 15 shows another embodiment of a containment ring 780 that is preferred for use with the carrier plate of FIG. 14A. The ring 780 is preferably tapered at 789 similar to the ring 80 in FIG. 1, along its outside circumference, so as to taper away from the polishing surface, which substantially planar contact surface 782 is designed to contact. Additionally, grooves or notches 784 are spaced about the inner circumference of the ring 780 to provide outlets for the pressurized fluid emitted by the carrier plate 755 during polishing.

An inner circumferential groove 786 joins the notches 784 thereby further enhancing the outlet path for the pressurized fluid. The inner circumference of the ring 780 also has a circumference having a diameter that is only slightly larger than the outer diameter of the plate 755 of the substrate carrier so as to form an outer boundary thereof, within which the substrate being polished is contained as it precesses and is polished. During the polishing process, as the substrate precesses, it covers a portion of the outer ring 761 at any given time and location of the precession path. The covered portion of the ring 761 takes advantage of the grooves 784 at that time as a pathway for the pressurized fluid which would ordinarily pass between the substrate and the ring, as does the flow in the areas where the substrate does not contact the containment ring 780 and cover a portion of the ring 761. This helps to maintain a more even pressure boundary around the entire circumference of the substrate during polishing. The ring 780 includes mounting holes 780' spaced to align with mounting holes in the carrier, similarly to the description provided above with regard to mounting holes 80'.

FIG. 16A is a sectional view of another embodiment of a carrier plate 850 according to the present invention. The carrier plate 855 is generally formed of a relatively strong, relatively non-corrosive metal, as described above with regard to the embodiment shown in FIG. 14A. Groove 861' and ring 861 are formed as described above with regard to groove 761' and ring 761 to form the restrictor in this embodiment. Only a single ring 861 is employed and a flow rate ranging from about 30 to about 100 cubic feet per hour, more preferably about 50 to 90 cubic feet per hour, and still more preferably about 60 to 70 cubic feet per hour is passed therethrough during operation. At least one pressure supply line 862, and preferably a plurality of lines, are provided for connecting the groove 861' to a pressurized fluid source via pressure fitting(s) 863 so as to supply a controlled flow of pressurized fluid to the ring 861.

Vacuum blow-off openings 865a and 865b are provided along two concentric imaginary circles, respectively, radially inward of groove 861'. Openings 865a and 865b are connected to at least two, and preferably a plurality of vacuum lines 867 for connection to a vacuum/pressure source to provide vacuum/blow off functions similar to that described above with regard to reference numeral 670 in FIG. 12A. During polishing, a positive or negative bleed can also be established through openings 865a and 865b in conjunction with the positive pressure flow through the restrictor (ring 861) to establish the air/fluid bearing between carrier plate 855 and the substrate. Additionally, a positive or negative pressure can be established in cavity 869 for purposes of deforming the carrier plate 855 to effect polishing forces against the substrate. Sealing members 871, such as an O-ring, diaphragm or piston ring are provided to seal the pressure flowing to the openings 865a, 865b from escaping to the exterior of the carrier plate 855 by pathways other than through the openings 865a, 865b. Another sealing member 878, which may also be a minimally preloaded O-ring, diaphragm or piston ring, is provided to seal the entire chamber 869 to allow generation of pressure or vacuum therein for extending/retracting the entire carrier plate 855 and/or deforming the carrier plate. A diaphragm is preferred as it is less likely to generate particles during wear.

Containment ring 880 is preferably tapered at 889 similar to the other embodiments of containment rings disclosed herein. However, this ring 880 is loosely mounted within carrier mount 890 to allow a precessing motion with respect thereto (see FIG. 16B). Additionally, an annular groove 892 is provided around the outer circumference of ring 880. A plurality of set screws or other retaining pins 891, preferably three or four, are threadably inserted and spaced equally about the inner circumference of the surface of the carrier mount 890 that interfaces with the outer circumference of ring 880. The amount of extension of the retaining pins 891 is adjustable to vary the precession pattern. The retaining pins 891 also retain the ring 880 with respect to the carrier mount 890, e.g., when the carrier is lifted from the polishing surface.

A porous ring 894 and groove 894' are formed and placed in a manner described above with regard to groove 761' and ring 761. At least one pressure supply line 896, and preferably a plurality of lines, are provided for connecting the groove 894' to a pressurized fluid source via pressure fitting(s) 897 so as to supply a controlled flow of pressurized fluid to the ring 894 to establish an air/fluid bearing between ring 880 and carrier mount 890.

The inner circumference 902 of the ring 880 is dimensioned to provide a snug fit with the substrate 1000. During a polishing operation, flow through ring 894 establishes a fluid/air bearing, as described above, which allows precession of the substrate 1000 and ring 880 as a unit. This feature is particularly advantageous when polishing substrates that include a flatted portion on the periphery thereof, or which are otherwise not completely circular, where precessing motions of the substrate can have damaging effects on the inner circumference of the containment ring due to repeated contact of the noncircular edge against the containment ring surface. Further, although a preferred shape is that of a ring 880, other shapes of containment barriers may be employed to allow the same precessing function, e.g., hexagonal, square, or even an irregularly shaped containment barrier.

The flow paths of the fluids from rings 861 and 894 are shown by arrows in FIG. 16B. The flow from ring 861 establishes a pressure or force "fence substantially near the outer circumference of the substrate 1000. Flow then travels along pathway 1002, in the gap between containment ring 880 and carrier plate 855 and above the substrate 1000 and out through vents 1006 which are circumferentially spaced about the carrier mount 890. The flow from ring 894 is mainly along two pathways. Pathway 1004 is between the containment ring 880 and carrier mount 890, and then out through vents 1006. Pathway 1005 is between the containment ring 880 and carrier mount 890, and then out through vents the gap between the outer circumference of the containment ring 880 and the carrier mount 890.

Alternatively, a precessing containment ring as described above may be employed in combination with other more conventional forms of carrier plate. For example, a carrier plate with a backing pad interposed between the plate and the substrate for transferring polishing forces between the plate and the substrate may be used. Also, a carrier plate which applies forces directly to the substrate by direct contact therewith may be used.

The foregoing description provides several examples of the present invention and is provided for illustrative purposes and to satisfy the requirements for obtaining a patent. As various changes can be made in the described apparatus and methods without departing from the spirit or scope of the invention as defined by the following claims, all matter in the description and drawings should be interpreted as illustrative and not in a limiting sense.

What is claimed is:

1. A substrate carrier for polishing a substrate against a polishing medium, said substrate carrier comprising:

a plate adapted to position a substrate substantially parallel with the polishing medium;

a first fluid outlet disposed proximate the perimeter of said plate for forming a gaseous layer from a first controlled flow between said plate and the substrate such that said plate does not contact the substrate; and, a second fluid outlet disposed in said plate radially inward of the first fluid outlet, the second fluid outlet having a second controlled flow that is independently controllable from the first flow, the second flow for modifying a pressure profile of the gaseous layer.

2. The substrate carrier of claim 1, wherein said first fluid outlet comprises a microporous material disposed in said plate.

3. The substrate carrier of claim 1, wherein said plate is substantially circular in cross-section and wherein said first fluid outlet comprises a ring substantially concentric with said plate.

4. The substrate carrier of claim 1 further comprising a third fluid outlet disposed in the plate radially inward of the second fluid outlet, the third fluid outlet having a third flow controlled independent of the first and second flows.

5. The substrate carrier of claim 1, wherein said first fluid outlet comprises a series of concentric grooves in said plate.

6. The substrate carrier of claim 1, wherein said second fluid outlet further comprises a pressure emitter.

7. The substrate carrier of claim 6, wherein said pressure emitter comprises a ruby orifice.

8. The substrate carrier of claim 4, wherein at least one of the outlets is connected with an external vacuum source.

9. The substrate carrier of claim 8, wherein two of said outlets are connected with an external vacuum source.

10. The substrate carrier of claim 4, wherein at least one of said outlets is open to atmospheric pressure.

11. The substrate carrier of claim 4, wherein at least one of said outlets is substantially filled with a microporous ring.

12. The substrate carrier of claim 11, wherein each said microporous ring is connected to an external source of pressure or vacuum.

13. The substrate carrier of claim 12, wherein each external source of pressure or vacuum is independent of the others.

14. The substrate carrier of claim 4, wherein each of said outlets is substantially filled with a microporous ring, each said microporous ring being connected to an independently controllable source of external pressure or vacuum.

15. The substrate carrier of claim 1, wherein said first fluid outlet comprises at least one circular groove through which a pressurized fluid is passed.

16. The substrate carrier of claim 15, wherein said at least one circular groove is substantially semicircular in cross-section.

17. The substrate carrier of claim 1, wherein said first fluid outlet comprises an air bearing.

18. The substrate carrier of claim 1, further comprising:
a containment ring radially external to said plate, wherein upon forming said gaseous layer, the substrate precesses within an area bounded by said containment ring.

19. The substrate carrier of claim 18, wherein said containment ring comprises:
a surface which contacts the polishing media during polishing; and
an undercut in said surface, said undercut adjoining defining said area bounded by said containment ring, and wherein said undercut does not contact the polishing media during polishing.

20. The substrate carrier of claim 18, wherein said containment ring comprises at least one groove on an inner circumference thereof, said at least one groove adapted to pass pressurized gas emitted by said first fluid outlet.

21. A substrate carrier for polishing a substrate against a polishing medium, said substrate carrier comprising:
a plate adapted to position a substrate substantially parallel with the polishing medium;
wherein said plate comprise a microporous material through which a bearing layer is established between said plate and the substrate such that said plate does not contact the substrate;
a carrier mount having the plate disposed thereunder; and
a containment barrier substantially surrounding said plate, wherein upon establishment of said bearing layer, the containment barrier precesses in relation to the carrier mount.

22. The substrate carrier of claim 21, wherein a face of said plate adjacent the substrate is microporous over substantially the entirety of said face.

23. The substrate carrier of claim 21, wherein said bearing layer is an air bearing.

24. The substrate carrier of claim 21, wherein said bearing layer is a liquid bearing.

25. The substrate carrier of claim 21, wherein said bearing layer comprises a mixture of gas and liquid.

26. A substrate carrier for polishing a substrate against a polishing medium, said substrate carrier comprising:
a plate adapted to position a substrate substantially parallel with the polishing medium; and
means for applying a non-uniform force across a back surface of the substrate to conform the substrate to a desired polishing conformation and to separate said plate from contact with the backside of the substrate.

27. The substrate carrier of claim 26, wherein said means for applying comprises a microporous ring disposed on said plate; and
at least one fluid outlet disposed in said plate inward of said ring.

28. The substrate carrier of claim 26, wherein a portion of said plate is microporous and forms part of said means for applying a differential force.

29. The substrate carrier of claim 28, wherein said plate is substantially circular and wherein said portion comprises a ring substantially concentric with said plate.

30. The substrate carrier of claim 29, wherein said means comprises three concentric rings.

31. A substrate carrier for polishing a substrate against a polishing medium, said substrate carrier comprising:
an air bearing for forming a gaseous bearing layer between said substrate carrier and the substrate such that said substrate carrier does not contact a back surface of the substrate during polishing; and
a containment barrier substantially surrounding said air bearing, wherein upon establishment of said bearing layer, the substrate and the containment barrier precess as a unit.

32. A fluid force method of polishing a substrate comprising:
positioning a substrate between a substrate carrier and a polishing medium:
applying non-uniform force across a backside of the substrate via the substrate carrier, so that the substrate contacts the polishing medium and the backside of the substrate does not contact the substrate carrier;
moving at least one of the substrate carrier and the polishing medium relative to the other according to a polishing pattern to maintain substantially constant relative velocity between the polishing medium and all points on the substrate carrier.

33. The method of claim 32, wherein said applying a force comprises applying pressurized gas from the substrate carrier toward the backside of the substrate to form a gaseous bearing layer between the substrate carrier and the substrate.

34. The method of claim 32, wherein said applying pressurized gas comprises applying pressurized air in a substantially continuous flow to form an air bearing between the substrate carrier and the backside of the substrate.

35. The method of claim 32, wherein said applying a force comprises applying pressurized liquid from the substrate carrier toward the backside of the substrate to form a liquid bearing layer between the substrate carrier and the substrate.

36. The method of claim 35, wherein said applying pressurized fluid comprises applying pressurized water in a substantially continuous flow to form a liquid bearing between the substrate carrier and the backside of the substrate.

37. The method of claim 35, wherein said applying pressurized fluid comprises applying pressurized water mixed with at least one gas in a substantially continuous flow to form a liquid bearing between the substrate carrier and the backside of the substrate.

38. The method of claim 37, wherein said at least one gas comprises air.

39. A method of polishing a substrate comprising:
positioning a substrate between a substrate carrier plate and a polishing medium:
applying a force to a backside of the substrate by flowing a fluid through a ring disposed in the substrate carrier plate between so that the substrate contacts the polishing medium and the backside of the substrate does not contact the substrate carrier plate;
adjusting the force to the backside of the substrate via a port disposed in the substrate carrier plate radially inward of the ring;
moving at least one of the substrate carrier plate and the polishing medium, relative to the other, to effect polishing of the substrate by the polishing medium.

40. The method of claim 39, wherein said applying a force comprises applying pressurized gas from the substrate carrier plate toward the backside of the substrate to form a gaseous bearing layer between the substrate carrier plate and the substrate.

41. The method of claim 39, wherein said applying pressurized gas comprises applying pressurized air in a substantially continuous flow to form an air bearing between the substrate carrier plate and the backside of the substrate.

42. The method of claim 39, wherein the substrate carrier plate comprises at least two applicators of pressure or vacuum for said applying force, the at least two applicators being connected to independently controllable external sources of pressure or vacuum, and wherein said adjusting the force to the backside of the substrate comprises adjusting at least one of the independently controllable external sources of pressure or vacuum to vary the flow rate thereof.

43. A method of polishing a substrate comprising:

exerting a pressurized gas between a substrate carrier and a back side of the substrate such that the backside of the substrate does not contact the substrate carrier;

creating a pressure gradient in the pressurized gas across the diameter of the substrate; and driving at least one of the substrate and a polishing surface to effect a polishing action between a front side of the substrate and the polishing surface, wherein the pressurized gas exerts a polishing force that is substantially normal to a direction of said driving.

44. The method of claim 43, wherein said driving further causes precessing of the substrate with respect to the substrate carrier.

45. A method of polishing a substrate comprising:

providing a substrate carrier having a backing surface and a containment ring surrounding a perimeter of the backing surface;

exerting a pressurized fluid between the backing surface and a back surface of the substrate such that the back surface of the substrate does not contact the backing surface; and precessing the substrate as a unit with the containment ring by driving at least one of the substrate carrier and a polishing surface to effect a polishing action between a front surface of the substrate and the polishing surface, wherein an outer perimeter of the containment ring is larger than an outer perimeter of the substrate to effect said precessing of the substrate within the containment ring during said driving.

46. The method of claim 45, wherein said driving further comprises driving at least one of the substrate carrier and the polishing surface to maintain substantially constant relative velocity between the polishing surface and all points on the substrate carrier.

47. A method of polishing a substrate comprising:

containing a substrate within a space defined by a substrate carrier, a containment ring and a polishing surface;

injecting a pressurized gas from a ring disposed in the substrate carrier, the pressurized gas forming a layer between a surface of the substrate carrier and the substrate such that the substrate does not contact the substrate carrier;

controlling flow through a port disposed in the substrate carrier inward of the ring, the port in fluid communication with the layer, the flow through the port controlled independent from the flow through the ring;

driving at least one of the substrate carrier and the polishing surface to effect a polishing action between a front side of the substrate and the polishing surface, wherein the pressurized gas exerts a polishing force that is substantially normal to a direction of said driving.

48. The method of claim 47, wherein said driving further causes precessing of the substrate with respect to the substrate carrier.

49. A substrate carrier for polishing a substrate against a polishing medium, said substrate carrier comprising:

a plate adapted to position a substrate substantially parallel with the polishing medium; and a containment barrier having an inner boundary adapted to fit snugly with a perimeter of the substrate, said containment barrier dimensioned and adapted to precess with respect to said plate during polishing.

50. The substrate carrier of claim 49, wherein said inner boundary of said containment barrier is larger than an outer perimeter of said plate so as to leave a gap between said inner boundary and said outer perimeter of said plate.

51. The substrate carrier of claim 49, wherein said containment barrier is ring shaped.

52. The substrate carrier of claim 49, further comprising:

a carrier mount to which said plate is mounted, said containment barrier being movably mounted to said carrier mount.

53. The substrate carrier of claim 52, further comprising a fluid bearing between said carrier mount and said containment barrier.

54. The substrate carrier of claim 53, wherein said fluid bearing is an air bearing, against which said containment barrier precesses during polishing motions.

55. The substrate carrier of claim 49, further comprising:

a force applicator for forming a fluid layer between said plate and the substrate such that said plate does not contact the substrate.

56. The substrate carrier of claim 55, wherein said force applicator comprises an air bearing.

57. The substrate carrier of claim 49, further comprising a backing pad interposed between said plate and the substrate for transferring polishing forces between said plate and the substrate.

58. The substrate carrier of claim 49, wherein said plate applies forces directly to the substrate by direct contact therewith.

59. A containment barrier for allowing precessing of a substrate as it is being polished, comprising:

an inner boundary adapted to fit snugly with a perimeter of the substrate; and means for mounting said barrier to a carrier mount while allowing rotation of the barrier with respect to the carrier mount during polishing.

60. The containment barrier of claim 59, wherein said means for mounting comprises a fluid bearing.

61. The containment barrier of claim 60, wherein said fluid bearing comprises an air bearing.

62. The containment barrier of claim 59, wherein said containment barrier is ring shaped.

63. A method of polishing a substrate comprising:

capturing a substrate within an inner perimeter of a containment barrier so that the substrate is not free to rotate with respect to the containment barrier;

applying a polishing motion to the substrate through the containment barrier and a carrier plate positioned above the substrate; and allowing the substrate and the containment barrier to precess with respect to the polishing movements of the carrier plate.

64. The method of claim 63, wherein said containment barrier precesses against a carrier mount via a fluid bearing.

65. The method of claim 64, wherein said containment barrier precesses against the carrier mount via an air bearing.

66. The substrate carrier of claim 1 further comprising:

a containment ring disposed radially outwards of the plate, wherein the ring rotates relative to the plate.

67. The substrate carrier of claim 66 further comprising:

a carrier mount;

a retaining pin disposed radially between the carrier mount and a groove disposed in the circumference of the containment ring; and a fluid bearing disposed between the carrier mount and the containment ring allowing the containment ring to rotate without contacting carrier mount.

68. The method of claim 33 further comprising:

venting a portion of the pressurized gas through an outlet disposed in the plate.

69. The method of claim 32, wherein the applying force comprises applying pressurized fluid at one or more outlets disposed on said plate at different radial distances from the center of the plate.

* * * * *

UNITED STATES PATENT AND TRADEMARK OFFICE
CERTIFICATE OF CORRECTION

PATENT NO.    : 6,276,998 B1                                   Page 1 of 1
DATED         : August 21, 2001
INVENTOR(S)   : Sommer et al.

It is certified that error appears in the above-identified patent and that said Letters Patent is hereby corrected as shown below:

Column 16,
Line 18, please replace "FIG. 1" with -- FIG. 11 --.

Column 18,
Line 50, please replace "1" with -- 5 --.

Column 21,
Line 6, please replace "39" with -- 40 --.

Signed and Sealed this

Twenty-fourth Day of June, 2003

JAMES E. ROGAN
*Director of the United States Patent and Trademark Office*